United States Patent [19]
Cox et al.

[11] Patent Number: 5,682,106
[45] Date of Patent: Oct. 28, 1997

[54] LOGIC MODULE FOR FIELD PROGRAMMABLE GATE ARRAY

[75] Inventors: William D. Cox, San Jose; Benjamin W. Blair, San Jose; Paige A. Kolze, San Jose; Hua-Thye Chua, Los Altos, all of Calif.

[73] Assignee: QuickLogic Corporation, Sunnyvale, Calif.

[21] Appl. No.: 755,758

[22] Filed: Sep. 18, 1996

Related U.S. Application Data

[60] Continuation of Ser. No. 501,644, Jul. 12, 1995, Pat. No. 5,654,649, which is a division of Ser. No. 379,061, Jan. 27, 1995, Pat. No. 5,477,167, which is a division of Ser. No. 246,527, May 20, 1994, Pat. No. 5,424,655.

[51] Int. Cl.$^6$ .......................... H03K 7/38; H03K 19/173
[52] U.S. Cl. ............................................ 326/39; 326/40
[58] Field of Search ................................... 326/39, 40

[56] References Cited

U.S. PATENT DOCUMENTS

| | | | |
|---|---|---|---|
| 3,629,863 | 12/1971 | Neale | 340/173 |
| 3,699,543 | 10/1972 | Neale | 340/173 |
| 3,987,287 | 10/1976 | Cox et al. | 235/152 |

(List continued on next page.)

FOREIGN PATENT DOCUMENTS

| | | |
|---|---|---|
| 0 265 554 | 5/1988 | European Pat. Off. . |
| 0 365 733 | 5/1990 | European Pat. Off. . |

OTHER PUBLICATIONS

"A CMOS Electrically Configurable Gate Array", K. El–Ayat et al., (1988) IEEE International Solid State Circuits Conference, 2 pgs.

Solid State Technology, vol. 34, No. 11, Nov. 1991, pp. 67–71,Wilson et al., "*A Four–Metal Layer, High Performance Interconnect System For Bipolar and BiCMOS Circuits*" (1991).

Proceedings of the IEEE 1989 Custom Integrated Circuits Conference, "*A 5000–Gate CMOS EPLD with Multiple Logic and Interconnect Arrays*", Wong et al., Session 5, pp. 5.8.1–5.8.4, May (1989).

"*An Architecture for Electrically Configurable Gate Arrays*", El–Gamal et al., IEEE Journal of Solid–State Circuits, vol. 24, No. 2, Apr. (1989), pp. 394–398.

Proceedings of the IEEE, "*Architecture of Field–Programmable Gate Arrays*", Rose et al., vol. 81, No. 7, pp. 1013–1029, Jul. (1993).

IEEE Journal of Solid–State Circuits, "*Architecture of Field Programmable Gate Arrays: The Effect of Logic Block Functionality on Area Efficiency*", Rose et al., vol. 25, No. 5, pp. 1217–1225, Oct. (1990).

IEEE Journal of Solid–State Circuits, "*A Water–Scale Digital Integrator Using Restructable VLSI*", J. Raffel et al., vol. SC–20, No. 1, pp. 399–406, Feb. (1985).

Microelectronics Journal, "*A Very–High–Speed Field–Programmable Gate Array Using Metal–to–Metal Antifuse Programmable Elements\**", Journal 23, No. 7, pp. 561–568 Nov. (1992).

(List continued on next page.)

*Primary Examiner*—Edward Westin
*Assistant Examiner*—Richard Roseen
*Attorney, Agent, or Firm*—Skjerven, Morrill, MacPherson, Franklin and Friel; T. Lester Wallace

[57] ABSTRACT

A programmable ASIC architecture allows the size of programming transistors to be reduced along with other parts of the device as advances in processing technology are made. Programming enable circuits are used to allow a programming address shift register having fewer bits to be used in the programming of antifuses. Methods of simultaneously programming multiple corresponding antifuses to speed ASIC programming are disclosed. Aspects of the architecture allow output protection for digital logic elements in modules to be eliminated, some testing transistors to be eliminated, the sizes of other testing transistors to be reduced, capacitances on interconnect wire segments to be reduced, some programming transistors to be eliminated, and the sizes of other programming transistors to be reduced.

13 Claims, 16 Drawing Sheets

U.S. PATENT DOCUMENTS

| | | | |
|---|---|---|---|
| 4,146,902 | 3/1979 | Tanimoto et al. | 357/6 |
| 4,177,475 | 12/1979 | Holmberg | 357/2 |
| 4,207,556 | 6/1980 | Sugiyama et al. | 340/166 |
| 4,399,372 | 8/1983 | Tanimoto et al. | |
| 4,420,766 | 12/1983 | Kasten | 357/59 |
| 4,433,331 | 2/1984 | Kollaritsch | 340/825.83 |
| 4,442,507 | 4/1984 | Roesner | 365/100 |
| 4,455,495 | 6/1984 | Masuhara et al. | |
| 4,494,220 | 1/1985 | Dumbri et al. | 365/200 |
| 4,499,557 | 2/1985 | Holmberg et al. | 365/163 |
| 4,543,594 | 9/1985 | Mohsen et al. | 357/51 |
| 4,609,830 | 9/1986 | Brandman | |
| 4,609,986 | 9/1986 | Hartmann et al. | 364/200 |
| 4,609,998 | 9/1986 | Bosnyak et al. | 365/96 |
| 4,642,487 | 2/1987 | Carter | |
| 4,651,409 | 3/1987 | Ellsworth et al. | 29/576 |
| 4,670,749 | 6/1987 | Freeman | 340/825.86 |
| 4,691,161 | 9/1987 | Kant et al. | 324/73 |
| 4,749,947 | 6/1988 | Gheewala | 324/73 |
| 4,758,745 | 7/1988 | El Gamal et al. | |
| 4,769,791 | 9/1988 | Liou et al. | 365/203 |
| 4,786,904 | 11/1988 | Graham, III et al. | 340/825.83 |
| 4,818,988 | 4/1989 | Cooperman et al. | 340/825.83 |
| 4,823,181 | 4/1989 | Mohsen et al. | 357/51 |
| 4,855,619 | 8/1989 | Hsieh et al. | |
| 4,857,774 | 8/1989 | El-Ayat et al. | |
| 4,870,302 | 9/1989 | Freeman | |
| 4,873,459 | 10/1989 | El Gamal et al. | |
| 4,881,114 | 11/1989 | Mohsen et al. | 357/54 |
| 4,899,205 | 2/1990 | Hamdy et al. | 357/51 |
| 4,910,417 | 3/1990 | El Gamal et al. | |
| 4,910,418 | 3/1990 | Graham et al. | |
| 4,914,055 | 4/1990 | Gordon et al. | 437/192 |
| 4,914,322 | 4/1990 | Win et al. | |
| 4,924,287 | 5/1990 | Orbach | 357/51 |
| 4,943,538 | 7/1990 | Mohsen et al. | 437/52 |
| 4,945,267 | 7/1990 | Galbraith | |
| 4,949,084 | 8/1990 | Schwartz et al. | 340/825.83 |
| 4,963,770 | 10/1990 | Keida | |
| 4,970,686 | 11/1990 | Naruke et al. | 365/96 |
| 4,972,105 | 11/1990 | Burton et al. | |
| 4,992,679 | 2/1991 | Takata et al. | 307/465 |
| 4,996,670 | 2/1991 | Ciraula et al. | 365/200 |
| 5,003,200 | 3/1991 | Sakamoto | |
| 5,008,855 | 4/1991 | Eltoukhy et al. | 365/96 |
| 5,015,885 | 5/1991 | El Gamal et al. | |
| 5,017,813 | 5/1991 | Galbraith et al. | |
| 5,027,012 | 6/1991 | Saeki et al. | |
| 5,049,969 | 9/1991 | Orbach et al. | 357/51 |
| 5,055,718 | 10/1991 | Galbraith et al. | |
| 5,073,729 | 12/1991 | Greene et al. | |
| 5,083,083 | 1/1992 | El-Ayat et al. | 324/158 |
| 5,095,228 | 3/1992 | Galbraith et al. | |
| 5,099,149 | 3/1992 | Smith | |
| 5,126,282 | 6/1992 | Chaing et al. | 437/172 |
| 5,130,777 | 7/1992 | Galbraith et al. | 357/51 |
| 5,132,571 | 7/1992 | McCollum et al. | |
| 5,134,457 | 7/1992 | Hamdy et al. | 357/51 |
| 5,172,014 | 12/1992 | El-Ayat et al. | |
| 5,187,393 | 2/1993 | El Gamal et al. | |
| 5,191,241 | 3/1993 | McCollum et al. | |
| 5,194,759 | 3/1993 | El-Ayat et al. | |
| 5,196,724 | 3/1993 | Gordon et al. | 257/530 |
| 5,198,705 | 3/1993 | Galbraith et al. | |
| 5,200,652 | 4/1993 | Lee | |
| 5,208,530 | 5/1993 | El-Ayat et al. | 324/158 |
| 5,220,213 | 6/1993 | Chan et al. | |
| 5,223,792 | 6/1993 | El-Ayat et al. | 324/158 |
| 5,237,219 | 8/1993 | Cliff | 307/465 |
| 5,243,226 | 9/1993 | Chan | |
| 5,294,846 | 3/1994 | Paivinen | |
| 5,302,546 | 4/1994 | Gordon et al. | 437/170 |
| 5,304,871 | 4/1994 | Dharmarajan et al. | |
| 5,309,091 | 5/1994 | El-Ayat et al. | 324/158 |
| 5,316,971 | 5/1994 | Chiang et al. | 437/170 |
| 5,317,698 | 5/1994 | Chan | 395/324 |
| 5,341,030 | 8/1994 | Galbraith | |
| 5,341,043 | 8/1994 | McCollum | |
| 5,341,092 | 8/1994 | El-Ayat et al. | 324/158 |
| 5,347,519 | 9/1994 | Cooke et al. | 371/22.2 |
| 5,367,207 | 11/1994 | Goetting et al. | 307/465 |
| 5,367,208 | 11/1994 | El Gamal et al. | 326/44 |
| 5,396,127 | 3/1995 | Chan et al. | 326/39 |
| 5,430,390 | 7/1995 | Chan et al. | 326/39 |
| 5,469,077 | 11/1995 | Cox | 326/38 |
| 5,477,165 | 12/1995 | ElAyat et al. | 326/38 |
| 5,488,317 | 1/1996 | Webster et al. | 326/45 |
| 5,493,526 | 2/1996 | Turner et al. | 365/185.33 |
| 5,504,439 | 4/1996 | Tavana | 326/38 |
| 5,504,440 | 4/1996 | Sasaki | 326/39 |
| 5,565,792 | 10/1996 | Chiang et al. | 326/39 |
| 5,587,669 | 12/1996 | Chan et al. | 326/39 |
| 5,594,364 | 1/1997 | Chan et al. | 326/39 |
| 5,606,267 | 2/1997 | El Ayat et al. | 326/39 |

OTHER PUBLICATIONS

Microprocessors and Microsystems, "*Field–Programmable gate array with non–volatile configuration*", Haines, vol. 13, No. 5, Jun. (1989), pp. 305–312.

Proceedings of the IEEE 1991 Custom Integrated Circuits Conference, "*FPGA Performance versus Cell Granularity*", Kouloheris et al., Session 6, pp. 6.2.1–6.2.4, May (1991).

The New York Times, "*Making Designer Chips on a Desktop Setup*", Pollack pp. 3 pages, Aug. (1991).

IBM Technical Disclosure Bulletin, "*Merged And/Or Array PLA Using Double Polysilicon FET Process*", Greenspan et al., vol. 23, No. 6, Nov. (1980).

IBM Technical Disclosure Bulletin, vol. 24, No. 7B, Dec. (1981), p. 3898, Askin et al., "*PLA With Segmented Lines For Faster Signal Processing*".

Electronic Design, "*programmable logic chip rivals gate arrays in flexibility*", Kitson et al., vol. 31, No. 25. pp. 95–100, Dec. (1983).

IBM Technical Disclosure Bulletin, vol. 19, No. 7, Dec. 1976, pp. 2628–2629, Conrad et al., "*Programmable Logic Array With Increased Personlization Density*".

IBM Technical Disclosure Bulletin, vol. 19, No. 6, Nov. 1976, pp. 2144–2145, Balasubramanian et al., "*Program Logic Array With Metal Level Personalization*".

ESD: The Electronic System Design Magazine, "*VLSI Design Technology, Logic Array Beats Development Time Blues*", Marr, pp. 38–41, Nov. (1989).

IEEE 1990 Custom Integrated Circuits Conference, "*Third–Generation Architecture Boosts Speed and Density of Field–Programmable Gate Arrays*", Hsieh et al., Session 31, May (1990).

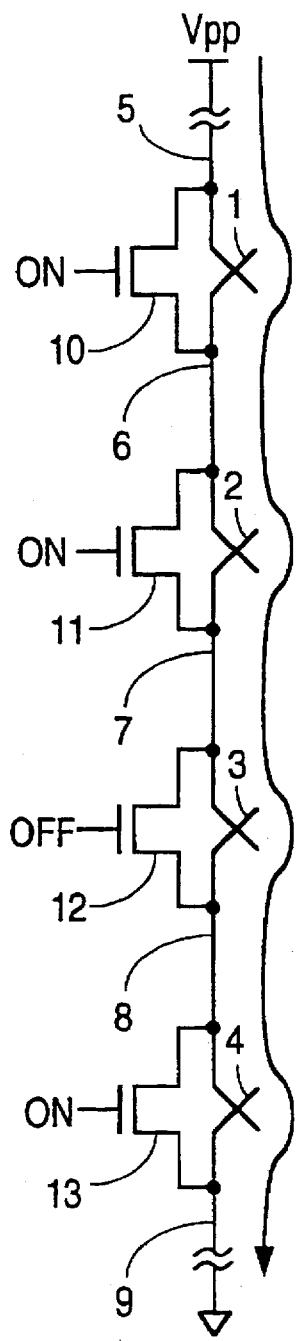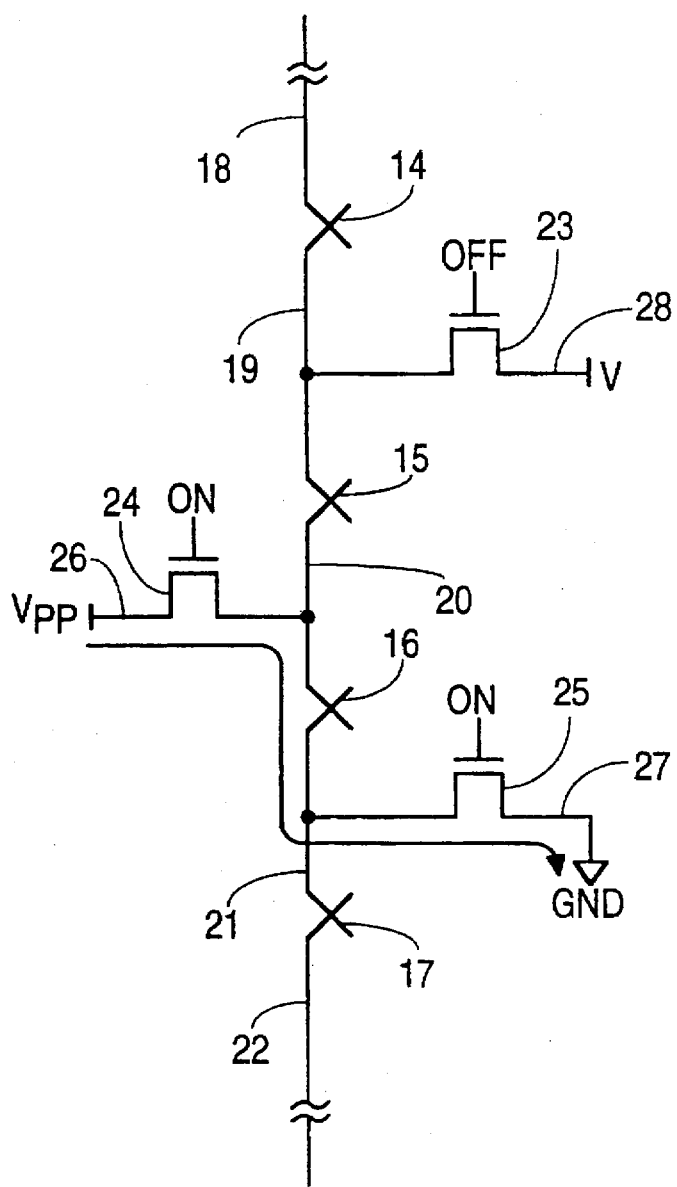
FIG. 1
(Prior Art)
FIG. 2

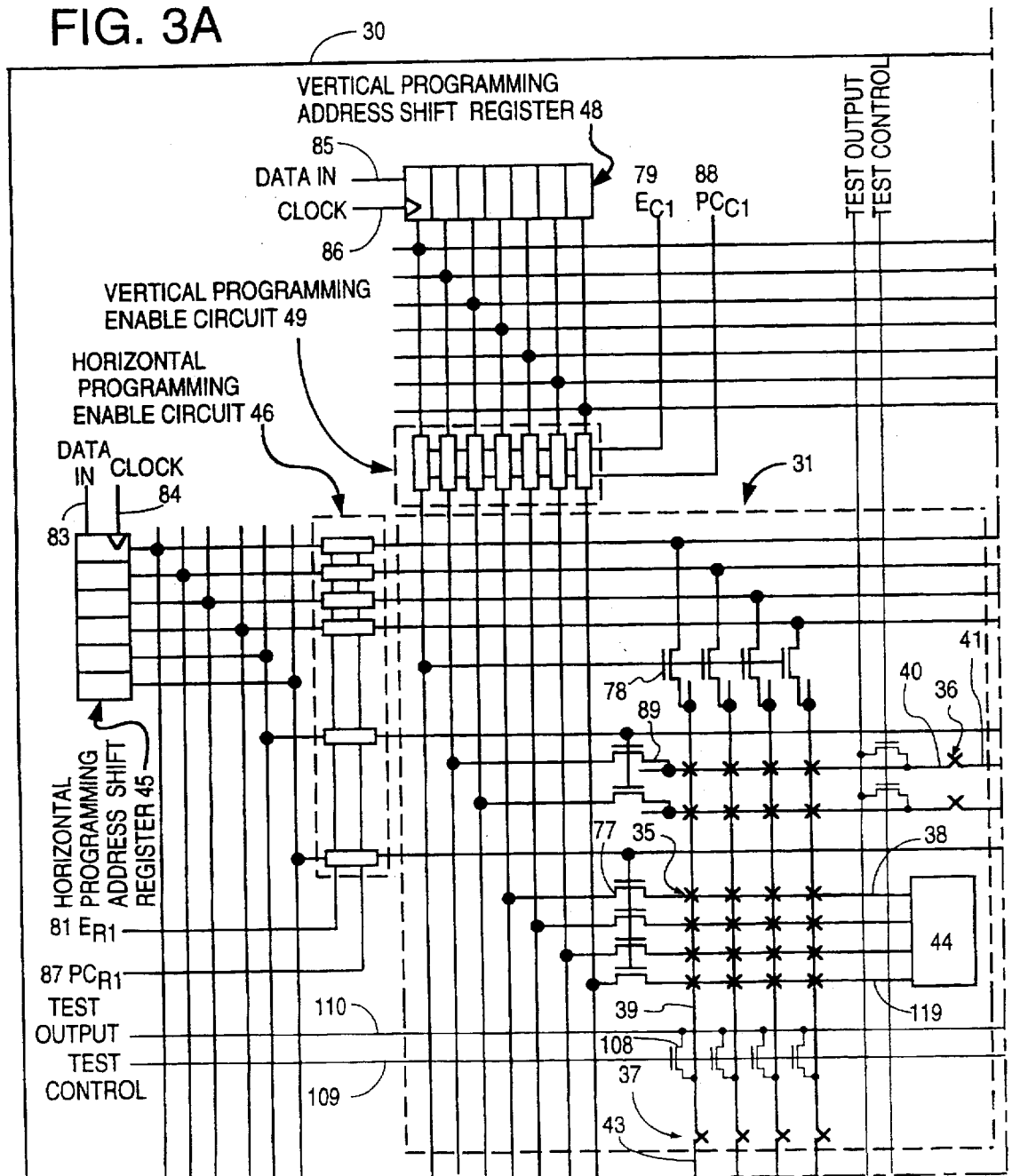

Key to FIG. 3

| FIG. 3A | FIG. 3B |
| FIG. 3C | FIG. 3D |

Programming Enable Circuit

| Inputs | | | Outputs | |
|---|---|---|---|---|
| I | E | PC | O | Og |
| 0 | 0 | 0 | Vpp/2 | 0 |
| 0 | 0 | 1 | Vpp/2 | 0 |
| 0 | 1 | 0 | Vpp/2 | 0 |
| 0 | 1 | 1 | Vpp/2 | 0 |
| 1 | 0 | 0 | Vpp/2 | 0 |
| 1 | 0 | 1 | Vpp/2 | 0 |
| 1 | 1 | 0 | 0 | Vgg |
| 1 | 1 | 1 | Vpp | Vgg |

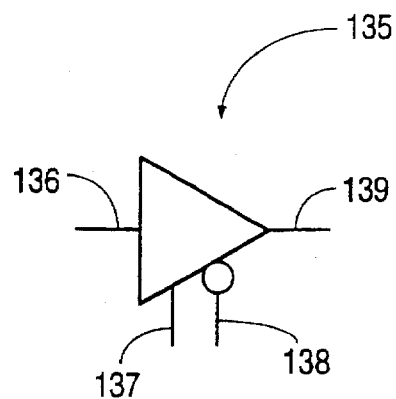
FIG. 17
| Input Terminal | | | Output Terminal |
|---|---|---|---|
| 136 | 137 | 138 | 139 |
| X | X | 1 | $V_{pp}/2$ |
| X | 0 | X | $V_{pp}/2$ |
| 1 | 1 | 0 | $V_{pp}$ |
| 0 | 1 | 0 | GND |
FIG. 18
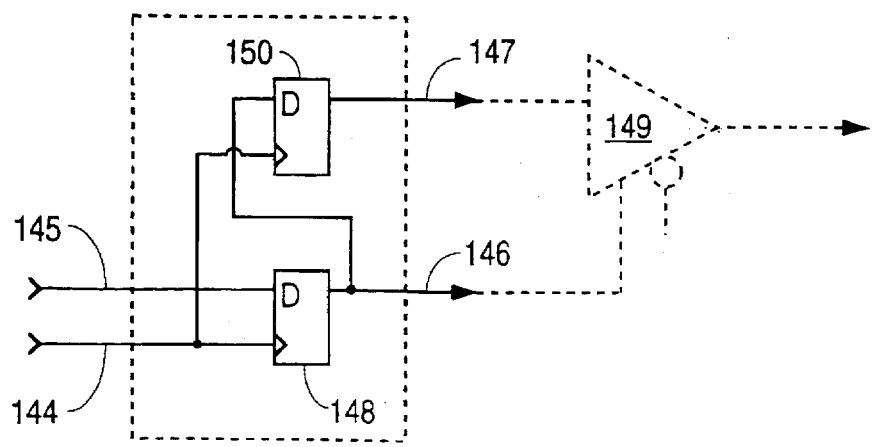
FIG. 19

LOGIC MODULE FOR FIELD PROGRAMMABLE GATE ARRAY

This application is a continuation of application Ser. No. 08/501,644, filed Jul. 12, 1995, now U.S. Pat. No. 5,654,649 which in turn is a divisional of application Ser. No. 08/379,061, filed on Jan. 27, 1995, (U.S. Pat. No. 5,477,167), which in turn is a divisional of application Ser. No. 08/246,527, filed on May 20, 1994, (U.S. Pat. No. 5,424,655).

FIELD OF THE INVENTION

This invention relates to programmable application specific integrated circuit devices employing antifuses.

BACKGROUND INFORMATION

A programmable application specific integrated circuit (ASIC) is a versatile integrated circuit chip, the internal circuitry of which may be configured before packaging by a manufacturer or after packaging by an individual user to realize a user-specific circuit. To configure a programmable ASIC, the user configures an on-chip interconnect structure of the programmable ASIC so that selected input terminals and selected output terminals of selected on-chip circuit components are electrically connected together in such a way that the resulting circuit is the user-specific circuit desired by the user. In a programmable ASIC employing, for example, amorphous silicon antifuses, selected amorphous silicon antifuses electrically disposed between selected wire segments are "programmed" to connect the selected wire segments together electrically. Which antifuses are programmed and which antifuses are left unprogrammed determines how the circuit components are interconnected and therefore determines the resulting circuit. Programmable ASICs can employ other types of antifuse structures including, for example, antifuses employing nitrides and oxides.

FIG. 1 (Prior Art) illustrates the programming of an antifuse of a programmable antifuse device in accordance with a prior art method. Four antifuses 1-4 are illustrated. Antifuse 1 is disposed between wire segments 5 and 6. Antifuse 2 is disposed between wire segments 6 and 7. Antifuse 3 is disposed between wire segments 7 and 8. Antifuse 4 is disposed between wire segments 8 and 9. Each of antifuses 1-4 has a corresponding pass programming transistor 10-13 disposed in parallel with the antifuse. Breaks are shown in wire segments 5 and 9 to indicate that the string of antifuses and wire segments includes more antifuses and wire segments than is shown. A string may, for example, comprise ten to fifteen antifuses and associated wire segments.

To program an antifuse in the string, a programming voltage Vpp is typically applied to one end of the string and a ground potential GND is typically applied to the other end of the string. This may be accomplished by turning on programming drivers (not shown) connected to the wire segments at either end of the string. If, for example, antifuse 3 is to be programmed, then pass programming transistors 10, 11 and 13 are turned on whereas pass programming transistor 12 is turned off. As a result, a voltage of sufficient magnitude develops across antifuse 3 such that antifuse 3 is programmed to be conductive.

In some antifuse structures such as some amorphous silicon antifuse structures having a given feature size, it is desirable to achieve a low programmed antifuse resistance. Such amorphous silicon antifuse structures are programmed with programming currents on the order of 12 mA or greater in order to achieve a desired low programmed antifuse resistance.

To maximize the amount of programming current available to program an antifuse in the string, the "on" resistance of the pass programming transistors in the string should be low. If, for example, the programming voltage Vpp is about 12 volts, and if there are eleven pass programming transistors in the string from programming voltage Vpp to ground potential GND, and if the programming current flowing through antifuse 3 in FIG. 1 is to be at least 12 mA, then each pass programming transistor must have an on resistance of 100 ohms or less.

Not only must the on resistance of the pass programming transistors be low, but the voltage at which the pass programming transistors break down should be high. Consider the attempted programming of antifuse 3. If pass programming transistor 12 were to break down at a lower voltage between wire segments 7 and 8 than the voltage at which antifuse 3 begins to be programmed, then pass programming transistor 12 would effectively shunt some of the programming current around antifuse 3. Accordingly, the amount of programming current which would flow through antifuse 3 could be insufficient to achieve the desired 50 ohm programmed resistance. Because both the breakdown voltage and the on resistance of a pass programming transistor are typically dependent upon the size of the pass programming transistor, the pass programming transistors in the structure of FIG. 1 are made sufficiently large to have a low enough on resistance and a high enough breakdown voltage to allow an adequate amount of programming current to flow through the antifuses to be programmed.

Although the architecture illustrated in FIG. 1 operates effectively, it is desirable to achieve the same functionality while utilizing a smaller amount of silicon area. Uniformly shrinking the structures illustrated in FIG. 1 may, however, result in pass programming transistors 10-13 being smaller and therefore having undesirably low breakdown voltages and undesirably high on resistances. Accordingly, an architecture is sought in which the transistors used to program antifuses can be reduced in size while maintaining the ability to program the antifuses with sufficient programming current.

SUMMARY

Architectures and associated methods are disclosed wherein programming current used to program an antifuse of a programmable ASIC flows through as few as two programming transistors. One programming transistor conducts a programming current from a first programming conductor to a first wire segment coupled to the antifuse. Another programming transistor conducts the programming current from a second wire segment coupled to the antifuse to a second programming conductor. Because the programming conductors are not driven with voltages during normal circuit operation such that the programming transistors will break down during normal circuit operation, high voltage breakdown requirements on the programming transistors are relaxed. Because there are fewer programming transistors in the path of the programming current, a higher on resistance of the programming transistors is acceptable. The size of the programming transistors and the size of the circuitry used to program the antifuses can therefore be reduced.

In accordance with another embodiment of the present invention, each row of macrocells has an associated programming enable circuit which can enable programming of antifuses in the row of macrocells. Similarly, each column of macrocells has an associated programming enable circuit which can enable programming of antifuses in the column of macrocells. If programming address shift registers are used, providing the programming enable circuits allows the programming address shift registers to entail fewer bits.

In accordance with another embodiment of the present invention, a method for programming multiple antifuses simultaneously and for reducing the total amount of time required to program a user-specific design into a programmable ASIC is disclosed.

In accordance with another embodiment of the present invention, a structure and associated method is disclosed wherein each wire segment directly coupled to either an input terminal or an output terminal of a logic module has a reduced capacitance. The operating speed of a user-specific circuit is therefore improved. Silicon area is saved in some embodiments by using circuitry inside logic modules to test the integrity of wire segments directly coupled to module circuitry, thereby eliminating the need for additional test circuitry coupled to these wire segments.

In accordance with another embodiment of the present invention, test transistors are provided. By coupling one electrode (source or drain) of each test transistor to an intermediate voltage when antifuses on the wire segment coupled to the test transistor are being programmed, the magnitude of the maximum voltage difference across the test transistor during programming is reduced. Accordingly, a test transistor having a lower breakdown voltage can be employed. A method is therefore disclosed which allows the test transistors to be relatively small transistors, thereby saving silicon area, lowering capacitance on wire segments, and improving circuit speed during normal circuit operation of the user-specific circuit programmed into the ASIC.

In accordance with another embodiment of the present invention, methods and structures are disclosed in which a digital logic element (for example an output inverter or an output buffer) in a logic module sinks programming current during the programming of an antifuse. The need for a programming transistor to sink the programming current and for output terminal protection for the digital logic element is therefore avoided resulting in a savings in silicon area.

BRIEF DESCRIPTION OF THE DRAWINGS

FIG. 1 (Prior Art) is a diagram illustrating the programming of an antifuse in accordance with a prior art method.

FIG. 2 is a simplified diagram illustrating the programming of an antifuse in accordance with an embodiment of the present invention.

FIGS. 3A–3D are simplified diagram of an upper-left corner portion of an integrated circuit chip in accordance with an embodiment of the present invention.

FIG. 17 is a diagram of a programming voltage driver used in the embodiment of FIG. 16.

FIG. 18 is a table which describes an operation of the programming voltage driver of FIG. 17.

FIG. 19 is a diagram showing the contents of one of the logic elements labeled 2D in FIG. 16.

DETAILED DESCRIPTION OF PREFERRED EMBODIMENTS

Figure 3B:
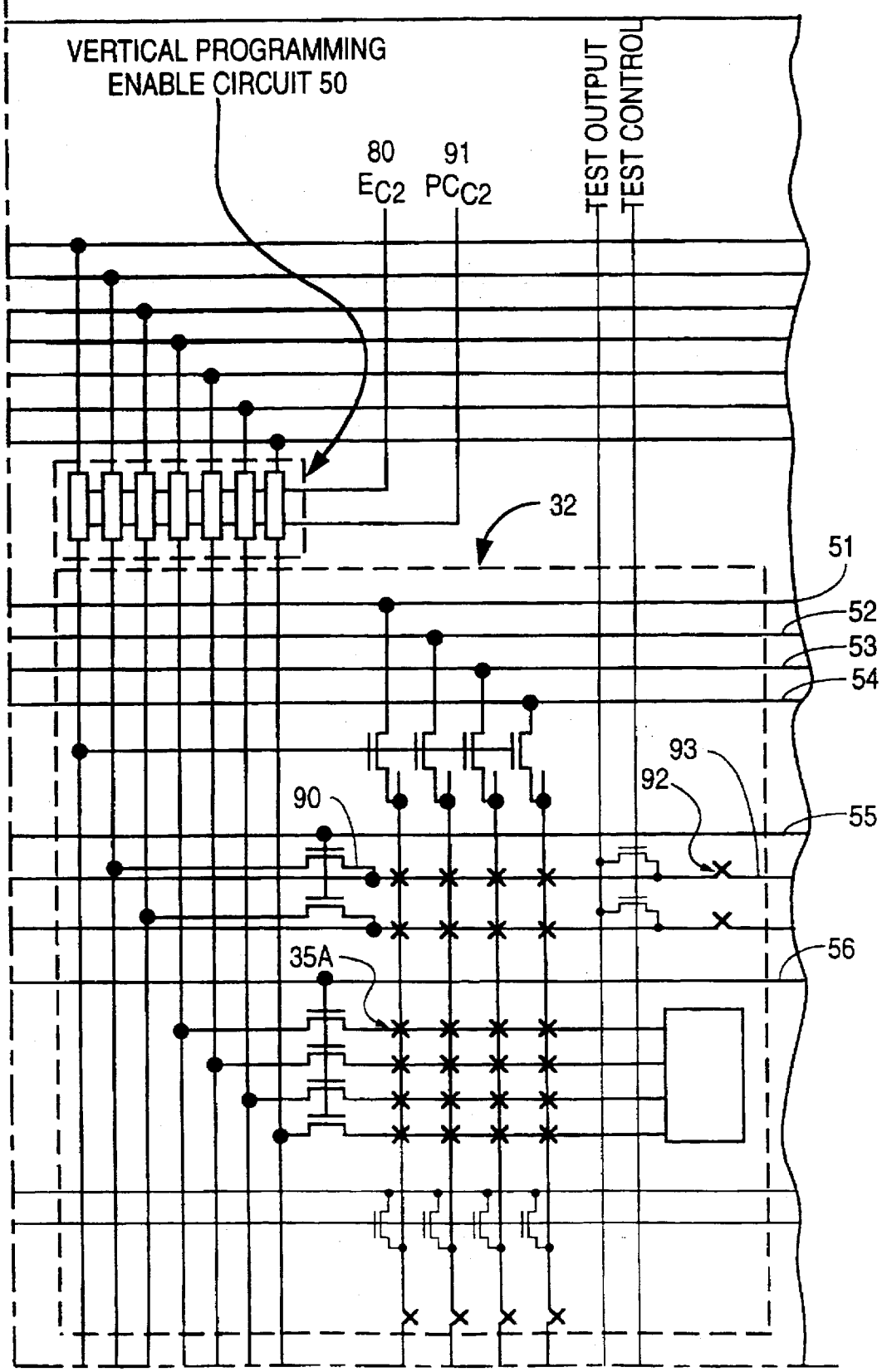
Figure 3C:
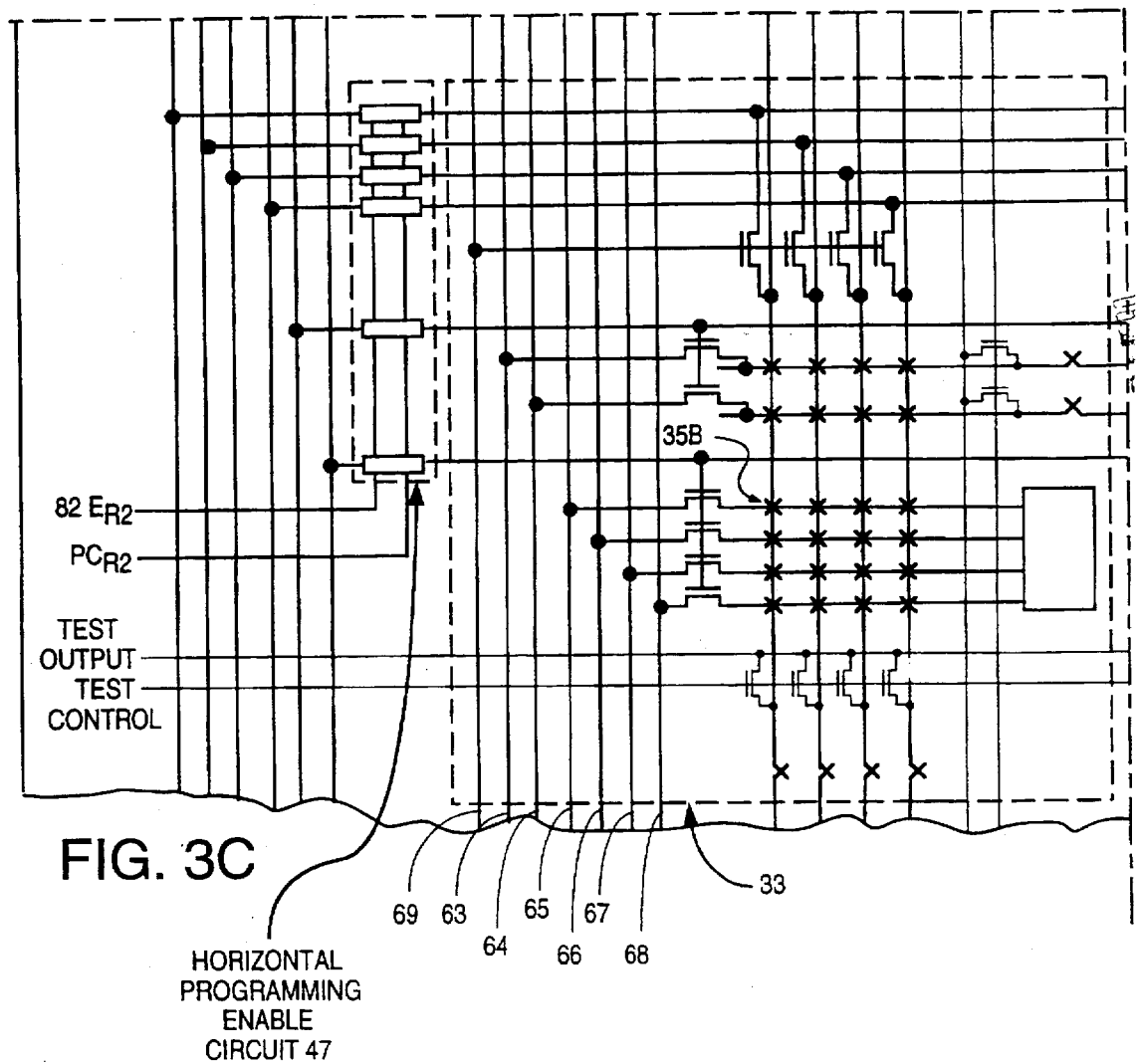

FIG. 2 is a simplified diagram of the programming of an antifuse in accordance with an embodiment of the present invention. Four antifuses 14–17 are illustrated. Antifuse 14 is disposed between wire segments 18 and 19. Antifuse 15 is disposed between wire segments 19 and 20. Antifuse 16 is disposed between wire segments 20 and 21. Antifuse 17 is disposed between wire segments 21 and 22. Rather than providing pass programming transistors disposed electrically in parallel with the antifuses and supplying the programming current through a string of pass programming transistors and wire segments to the antifuse to be programmed, individual programming transistors 23–25 are provided to couple each of wire segments 19–21 to a source of a programming voltage.

To program antifuse 16, for example, programming transistors 24 and 25 are turned on. A programming voltage Vpp (for example, 12 volts) supplied by a programming driver (not shown) onto wire segment 26 is therefore coupled via conductive programming transistor 24 to wire segment 20. A ground potential GND (for example, 0 volts) supplied by a programming driver (not shown) onto wire segment 27 is therefore also coupled via programming transistor 25 to wire segment 21. As a result, a sufficient voltage develops across antifuse 16 that antifuse 16 is programmed, a programming current flowing from the programming driver (not shown) supplying the programming voltage Vpp, through wire 26, through conductive programming transistor 24, through wire segment 20, through antifuse 16 being programmed, through wire segment 21, through conductive programming transistor 25, through wire segment 27, and to the programming driver (not shown) supplying the ground potential GND.

To prevent antifuse 15 from being programmed, programming transistor 23 is turned off, or an intermediate voltage V is supplied to wire 28 which will not result in antifuse 15 being programmed, or both. If, for example, programming transistor 23 is controlled to be conductive, if antifuse 15 has a structure that will program if a voltage greater than Vpp/2 is applied across it, and if wire segment 26 is driven with programming voltage Vpp as illustrated, then intermediate voltage V has a magnitude of between Vpp and Vpp/2.

In the structure of FIG. 2, the programming transistors 23–25 are not electrically disposed in parallel with the antifuses as they are in FIG. 1. Accordingly, the programming transistors do not have to maintain low leakage at high voltages during programming. Because the output terminals of the programming drivers supplying the programming voltages (in this case 12 volts and 0 volts) are placed in a high impedance state during normal circuit operation, leakage through the programming transistors is also not a problem during normal circuit operation.

Moreover, the on resistance of the programming transistors can be greater than in the case of the architecture of FIG. 1 because a relatively fewer number of programming transistors is present in the path of the programming current. If, for example, antifuse 16 is to be programmed with a programming voltage of at least 12 mA, and if the resistance of the wires in the programming path is assumed to be negligible, and if Vpp is 12 volts, then the on resistance of pass transistors 24 and 25 may be as large as 500 ohms. Accordingly, the size of the pass transistors may be reduced along with the sizes of the other elements in the architecture of FIG. 2 without reducing the programming current usable to program antifuses.

Figures 3, 3D:
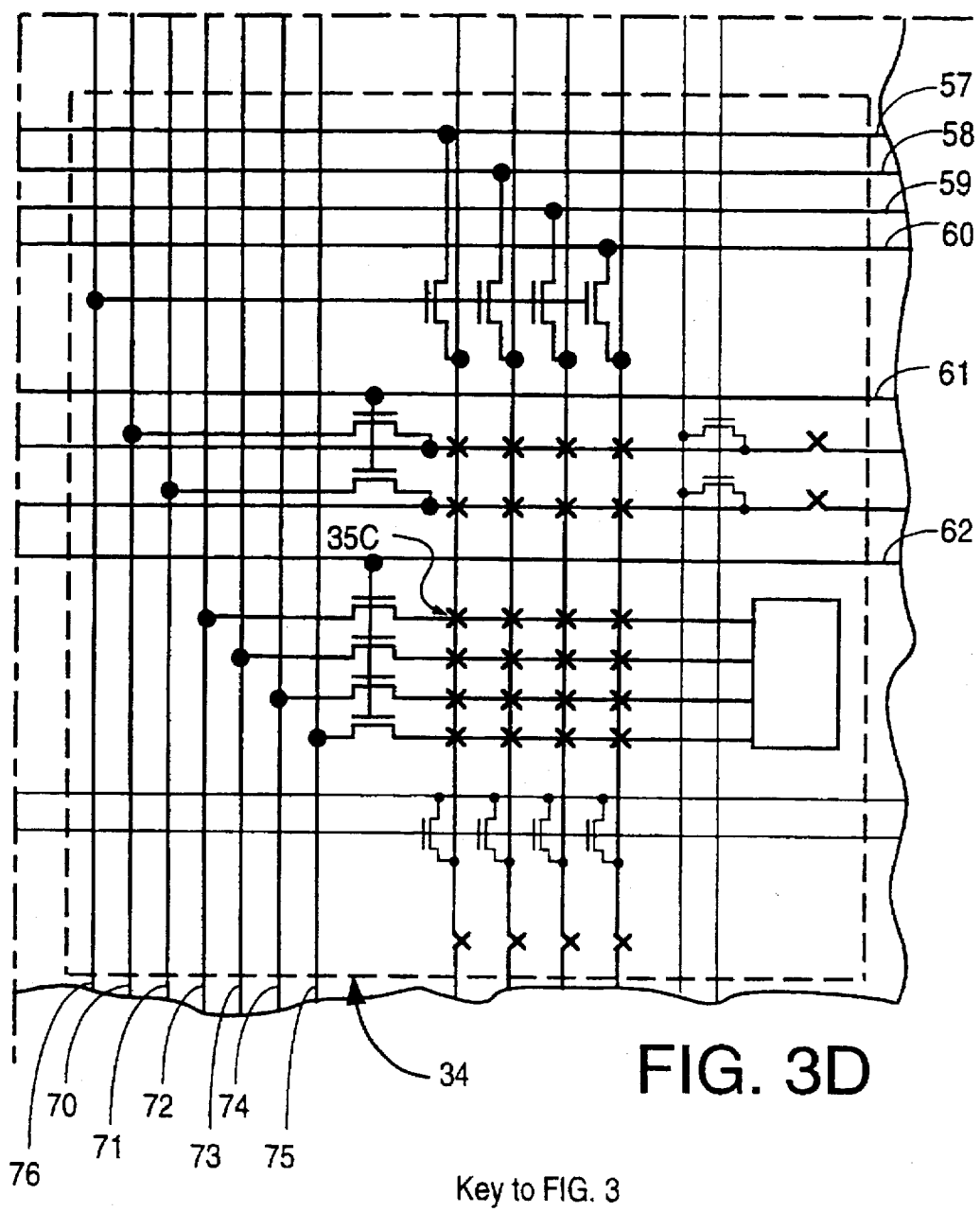

FIG. 3 is a simplified conceptual diagram of an upper-left corner portion of an integrated circuit chip 30 in accordance with an embodiment of the present invention. The corner portion of integrated circuit chip 30 comprises four macrocells 31–34 depicted in FIG. 3 with dashed boxes. The macrocells are organized into rows and columns. Each macrocell comprises a plurality of antifuses, a plurality of programming transistors, a plurality of interconnection wire segments and a module. The antifuses of integrated circuit 30 can be classified as "cross antifuses", "horizontal antifuses" and "vertical antifuses". For clarity of illustration, only a few of the antifuses, antifuses 35, 35A, 35B, 35C, 36, 37, and 92 are labeled in FIG. 3.

Figure 4:
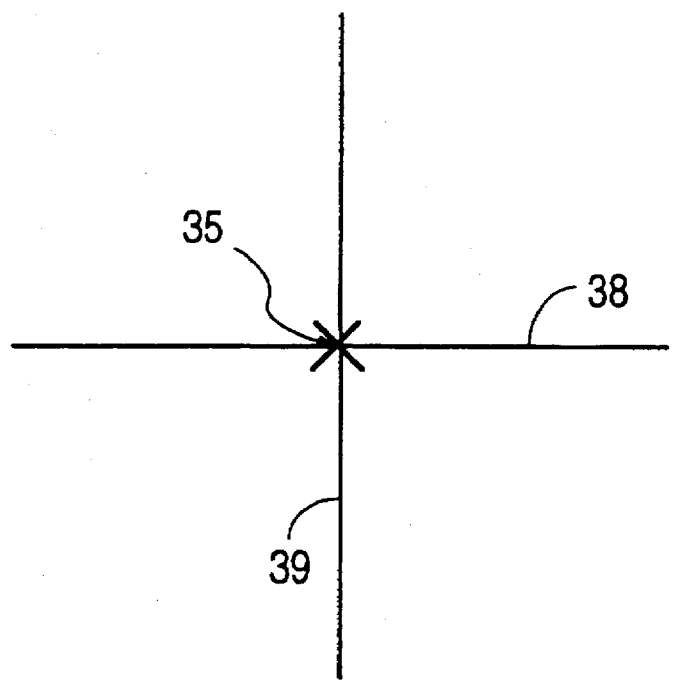
FIG. 4 is a diagram showing a symbol of a cross antifuse.

FIG. 4 is a more detailed diagram of a symbol of a "cross antifuse". If programmed, cross antifuse 35 electrically connects a horizontally extending wire segment 38 to a vertically extending wire segment 39.

Figure 5:
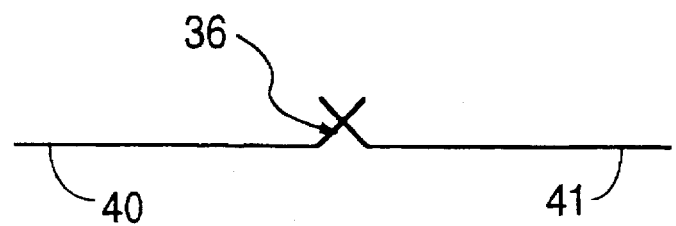
FIG. 5 is a diagram showing a symbol of a horizontal antifuse.

FIG. 5 is a more detailed diagram of a symbol of a "horizontal antifuse". If programmed, horizontal antifuse 36 electrically connects a horizontally extending wire segment 40 to another horizontally extending wire segment 41.

Antifuse 37 is a "vertical antifuse" (of similar construction to a horizontal antifuse) which, if programmed, electrically connects a vertically extending wire segment 39 to another vertically extending wire segment 43. In some embodiments, the horizontally extending wire segments are substantially formed in a first metal layer of the integrated circuit whereas the vertically extending wire segments are substantially formed in a second metal layer. Antifuses are disposed in vias between the first and second metal layers. Selected ends of adjacent horizontally extending wires in a string may extend from one metal layer to the other metal layer so that antifuses disposed between the first and second layers can be programmed to connect adjacent horizontal colinearly extending wires of the string together end-to-end. Similarly, selected ends of adjacent vertical extending wires in a string may extend from one metal layer to the other metal layer so that antifuses disposed between the first and second layers can be programmed to connect adjacent vertical colinearly extending wires of the string together end-to-end. U.S. patent application Ser. Nos. 07/447,969 and 07/698,648 describe a suitable antifuse structure.

Figure 3E:
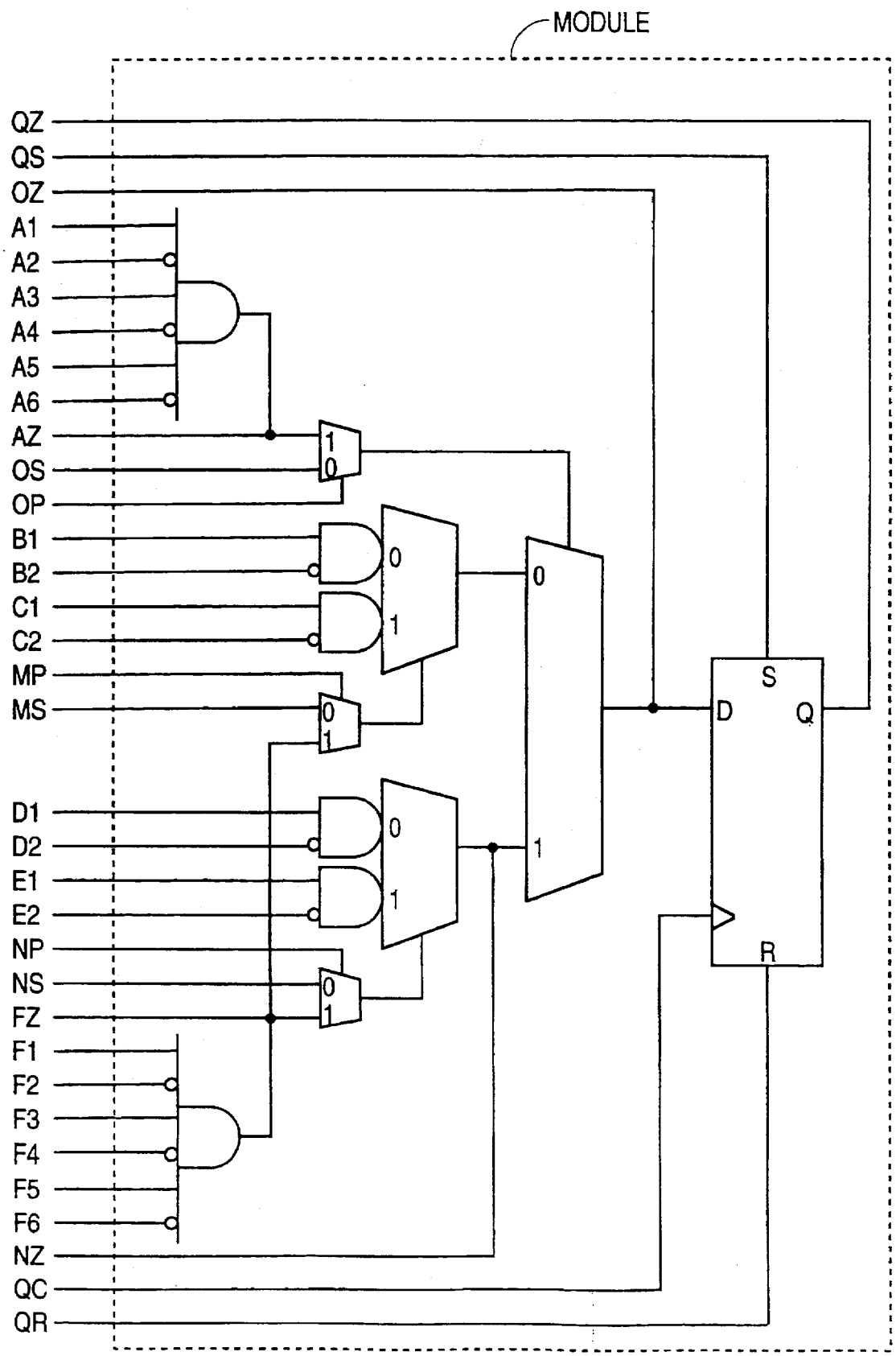
FIG. 3E is a simplified diagram of one possible embodiment of a logic module in accordance with an embodiment of the present invention.

Each macrocell also comprises a module. The uppermost and leftmost macrocell 31, for example, comprises a module 44. The modules may contain the versatile digital logic components disclosed in U.S. Pat. No. 5,220,213. Modules as set forth in FIG. 3E may be used. Alternatively, the modules may contain other combinations of digital logic components and/or analog circuitry. In some embodiments, certain of the modules contain circuitry different from other of the modules.

In the embodiment of FIG. 3, both the input terminals of the circuitry in module 44 as well as the output terminals of the circuitry in module 44 are disposed on the left side of module 44, each of the input terminals and the output terminals being directly connected to respective horizontally extending wire segments of macrocell 31 without any intervening isolating pass transistors. Although not shown in FIG. 3, the horizontally and vertically extending wire segments in the macrocells adjacent the periphery of integrated circuit chip 30 may be directly connected to input/output circuitry (such as I/O input/output driver circuits for receiving and driving signals on and off integrated circuit chip.30). For example, horizontally extending wire segment 40 may extend to the left farther than is shown in FIG. 3 and may extend to an I/O circuit coupled to a bonding pad adjacent the periphery of integrated circuit 30 whereas wire segment 41 is not adjacent the chip periphery and is therefore not directly connected to any such I/O circuitry.

To program selected antifuses of integrated circuit 30, a horizontal programming address shift register 45, two horizontal programming enable circuits 46 and 47, a vertical programming address shift register 48, and two vertical programming enable circuits 49 and 50 are provided.

Horizontally extending programming conductors 51–54 as well as horizontally extending control conductors 55 and 56 extend through the uppermost row of macrocells 31 and 32 and are coupled to horizontal programming enable circuit 46. Similarly, horizontally extending programming conductors 57–60 as well as horizontally extending control conductors 61 and 62 extend through the next row of macrocells 33 and 34 and are coupled to horizontal programming enable circuit 47. The structure of each row of macrocells and its associated programming enable circuit is identical to the structure of each other row. Note that the horizontal and vertical programming conductors extend through many columns and rows of macrocells, respectively, without being broken up into segments by intervening transistors.

Likewise, vertically extending programming conductors 63–68 as well as vertically extending control conductor 69 extend through the leftmost column of macrocells 31 and 33 and are coupled to vertical programming enable circuit 49. Similarly, vertically extending programming conductors 70–75 as well as vertically extending control conductor 76 extend through the next column of macrocells 32 and 34 and are coupled to vertical programming enable circuit 50. The structure of each column of macrocells and its associated programming enable circuit is identical to the structure of each other column.

Figures 6, 7:
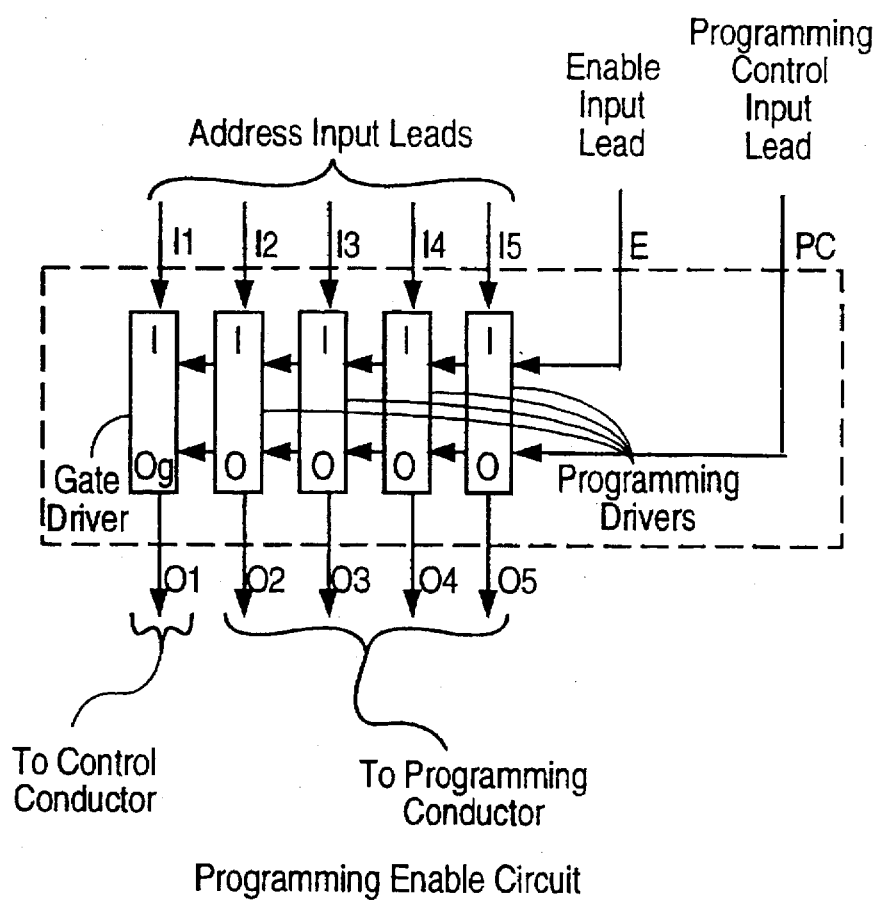
FIG. 6 is a diagram of a programming enable circuit in accordance with an embodiment of the present invention.
FIG. 7 is a table setting forth the operation of gate drivers and programming drivers of the programming enable circuit of FIG. 6.

FIGS. 6 and 7 set forth an operation of a programming enable circuit. Each programming enable circuit includes gate drivers and programming drivers. The programming enable circuit illustrated in FIG. 6 has one gate driver and four programming drivers. Gate drivers are coupled to gates of programming transistors and can output voltages of 0 (for example, 0 volts) or Vgg (for example, 13 volts) to make selected programming transistors either nonconductive (i.e., "off") or conductive (i.e., "on"), respectively. Programming drivers, on the other hand, are coupled to programming conductors and can output voltages of ground or a digital "0" (for example, 0 volts), an intermediate voltage (for example, Vpp/2 or a programming voltage Vpp (for example, 12 volts). Each driver has an address input lead and an enable input lead. Programming drivers also have a programming control input lead.

As illustrated in FIGS. 3 and 6, the respective address input leads of the horizontal programming enable circuits 46 and 47 are coupled together in parallel to corresponding bit output leads of the horizontal programming address shift register 45. Similarly, the respective address input leads of the vertical programming enable circuits 49 and 50 are coupled together in parallel to corresponding bit output leads of the vertical programming address shift register 48. If addressed, a gate driver can output a voltage Vgg when enabled and voltage 0 when not enabled. If addressed, a programming driver can output a voltage 0 or Vpp when enabled depending on the value of the signal on the programming control input lead.

Operation of the programming circuitry is explained further in connection with an example of how cross antifuse 35 may be programmed. In order to place a voltage of magnitude greater than Vpp/2 across antifuse 35, programming transistor 77 must be turned on and programming transistor 78 must be turned on. Vertically extending programming conductor 65 and horizontally extending programming conductor 51 must be driven with different voltages. To prevent unintended programming of antifuses when the programming address shift registers 45 and 48 are loaded, a digital 0 (for example, 0 volts) is supplied to the enable input leads 79–82 of the programming enable circuits. Consequently, all programming drivers output voltages of Vpp/2 (for example, 6 volts) and no antifuses are programmed. In some embodiments, the enable input leads are coupled substantially directly to enable input terminals (not shown) of the integrated circuit 30. In other embodiments, each enable input lead is coupled to an output lead of a flip-flop of a shift register (not shown) which is serially loaded via terminals (not shown) of the integrated circuit 30. The terminals of the integrated circuit 30 may be configured to have dual uses: one use (as for example programming control) during antifuse programming and another use (as for example an input or output terminal of the user-specific circuit) during normal operation of the integrated circuit.

The horizontal programming address shift register 45 is serially loaded via input leads 83 and 84 so that the output leads of horizontal programming address shift register 45 output address values of 100001, from top to bottom in FIG. 3. Similarly, vertical programming address shift register 48 is serially loaded via input leads 85 and 86 so that the output leads of vertical programming address shift register 48 output address values of 1001000, from left to right in FIG. 3. Input leads 83–86 in some embodiments are coupled substantially directly to corresponding terminals (not shown) of the integrated circuit 30.

To cause a programming current to flow through a selected cross antifuse, the enable input leads of the row and column corresponding to that cross antifuse are supplied with a digital 1. Accordingly, a digital 1 signal is supplied to enable input leads 79 and 81. The enable input leads of the other rows and columns are not supplied with digital 1 signals unless the cross antifuses in other macrocells corresponding with cross antifuse 35 are to be simultaneously programmed. If programming control input terminal 87 is supplied with a digital 0 and programming control input terminal 88 is supplied with a digital 1, then vertically extending programming conductor 65 is driven with voltage Vpp and horizontally extending programming conductor 51 is driven with voltage 0. Consequently, current flows from the addressed programming driver of vertical programming enable circuit 49, through vertically extending programming conductor 65, through conductive programming transistor 77, through horizontal wire segment 38, thorough cross antifuse 35 being programmed, through vertical wire segment 39, through conductive programming transistor 78, through horizontally extending programming conductor 51, and to the addressed programming driver of horizontal programming enable circuit 46.

To reverse the direction of current flow through cross antifuse 35, the digital values of the signals supplied to programming (polarity) control input leads 87 and 88 are reversed. No reshifting of flip-flops of an address shift register is required. A programming of antifuses with bidirectional programming currents is set forth in U.S. Pat. No. 5,302,546.

If, for example, the cross antifuses 35A, 35B and 35C in macrocells 32, 33 and 34 which correspond with cross antifuse 35 were to be programmed as well, then all of antifuses 35, 35A, 35B and 35C are programmed together at once by enabling the programming enable circuits 46, 47, 49 and 50. It is therefore seen that multiple corresponding antifuses in different macrocells can be programmed simultaneously in accordance with embodiments of the present invention thereby reducing the amount of time required to program a user-specific circuit into a programmable ASIC.

To program a horizontal antifuse, for example antifuse 36, the enable input leads of all programming enable circuits are again initially supplied with a digital 0. The vertical programming address shift register 48 is serially loaded such that the output leads of vertical programming address shift register 48 output address values of 0100000, from left to right in FIG. 3. The horizontal programming address shift register 45 is serially loaded such that the output leads of horizontal programming address shift register 45 output address values of 000010, from top to bottom in FIG. 3. Accordingly, when the enable input leads 79, 80 and 81 are supplied with a digital 1, programming transistors 89 and 90 are turned on. Programming current is made to flow through horizontal antifuse 36 when the signal supplied to programming control input lead 88 has the opposite digital value of the signal supplied to programming control input lead 91. The direction the programming current flows through horizontal antifuse 36 is reversed in some programming methods by reversing the digital values on both programming control input leads 88 and 91.

If, for example, the next antifuse to the right in the string, horizontal antifuse 92, is not to be programmed, then the enable input lead of the horizontal programming enable circuit corresponding with the next column of macrocells to the right (not shown) is driven with a digital 0, thereby ensuring that horizontal wire segment 93 will be driven with intermediate voltage Vpp/2. Because horizontal wire segment 93 is driven with voltage Vpp/2 and horizontal wire segment 41 is driven with either voltage 0 or Vpp during programming of antifuse 36, a voltage of sufficient magnitude cannot be dropped across antifuse 92 to program antifuse 92. In this way, multiple selected antifuses between adjacent horizontal wire segments in a string can be programmed at once if desired without programming all antifuses in the string.

The programming of vertical antifuses is carried out in similar fashion to the programming of horizontal antifuses.

Figure 8:
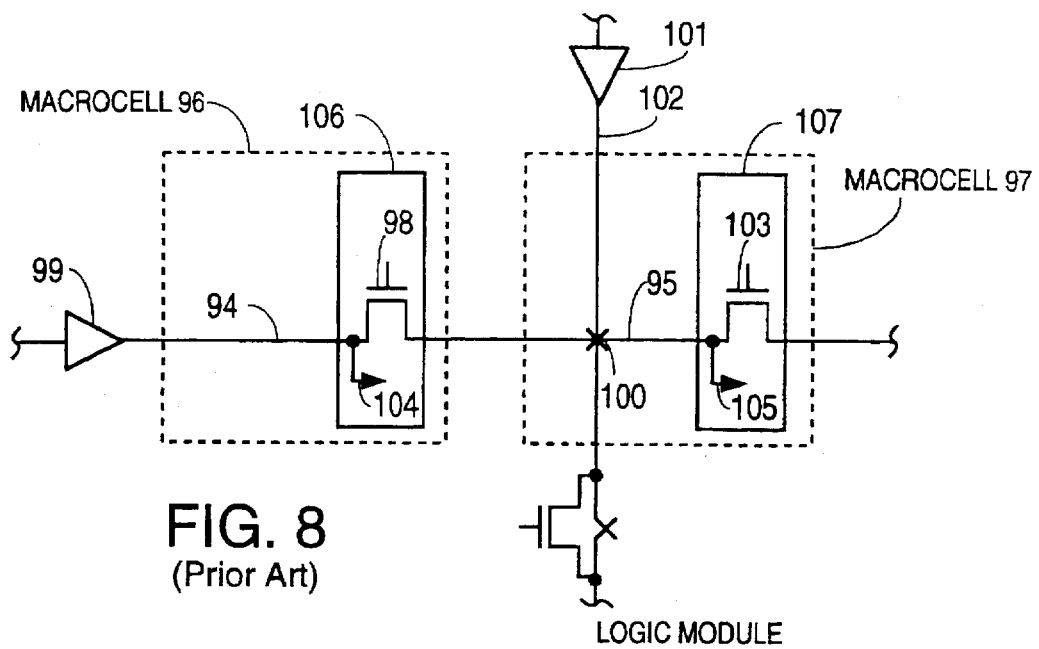
FIG. 8 (Prior Art) is a diagram illustrating a prior art architecture in which horizontal wire segments are coupled together end-to-end during programming by intervening transistors.

FIG. 8 (Prior Art) shows an architecture in which horizontal wire segments 94 and 95 of macrocells 96 and 97 are coupled together during programming by a transistor 98. Transistor 98 is provided so that a programming voltage from programming driver 99 can be driven onto horizontal wire segment 95 to program cross antifuse 100 when programming driver 101 forces vertical wire segment 102 to ground potential. Transistors 98 and 103 are made nonconductive to isolate horizontal wire segments 94 and 95 from one another during normal circuit operation. Arrows 104 and 105 indicate that horizontal wire segments 94 and 95, respectively, are coupled to logic inside modules 106 and 107, respectively.

Figure 9:
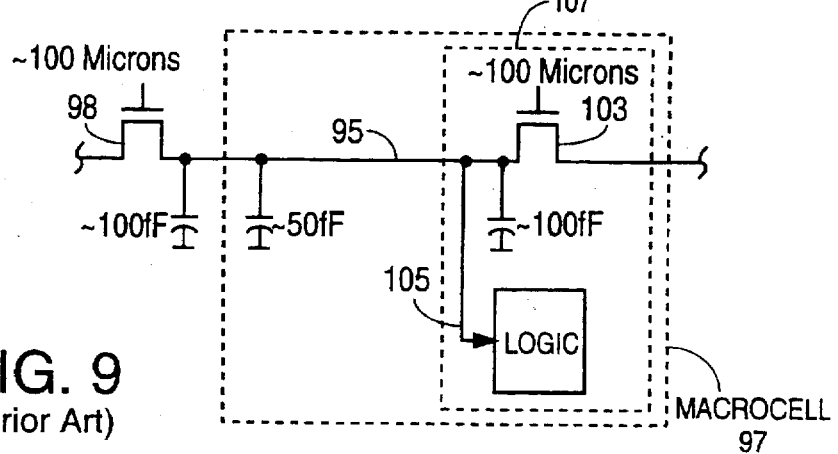
FIG. 9 (Prior Art) is a simplified diagram of a part of the structure illustrated in FIG. 8.

FIG. 9 (Prior Art) is a simplified diagram of a part of the architecture of FIG. 8. Transistors 98 and 103 have gate widths of approximately 100 microns and each add approximately 100 fF of capacitance to the approximately 50 fF of horizontal wire segment 95.

Figure 10:
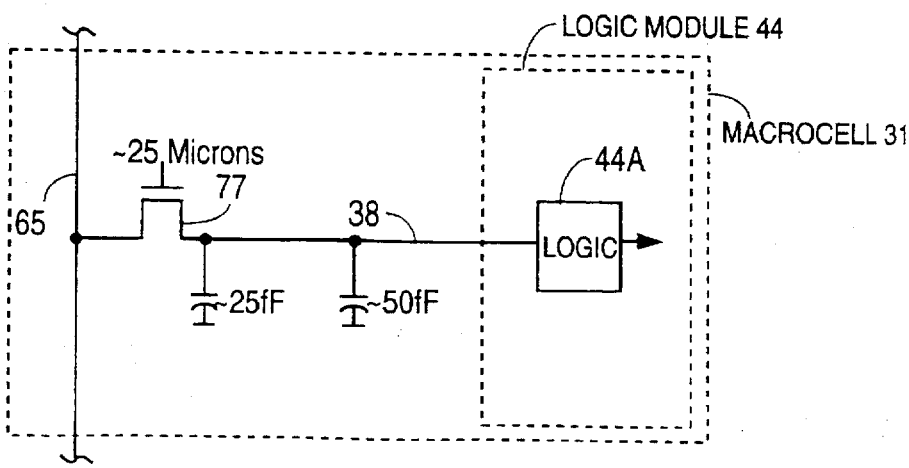
FIG. 10 is a simplified diagram of a part of FIG. 3 illustrating a reduction in capacitance on a horizontal wire segment.

FIG. 10 is a simplified diagram of a part of FIG. 3. Programming transistor 77 can now be made with a smaller gate width, thereby reducing the capacitance added to horizontal wire segment 38 to, for example, approximately 25 fF. Moreover, transistor 103 is not required because programming voltages do not need to be conducted through the columns of logic modules across the chip. Accordingly, space is saved by removing transistor 103, space is saved by reducing the size of the programming transistor 77 provided, and the total capacitance on the horizontal wire segment is reduced thereby improving operating speed of the programmable ASIC.

In the embodiment of FIG. 10, the integrity of wire segment 38 may be tested by detecting digital voltage levels transmitted to the logic module using logic 44A in the logic module itself. Each of the modules has an additional scan test output lead (not shown). In one example, the scan test output leads of all the modules in a column of the integrated circuit are hardwired together in a wire-OR configuration to a vertically extending scan test conductor (not shown). By enabling the scan test output leads of a row of modules, by driving a signal onto the horizontal wire segment of the corresponding module in a column of modules, by detecting the corresponding signal on the vertically extending scan test conductor, and by repeating this process for the module in each of the rows of the column, the integrity of the horizontal wire segments leading into each of the modules of the column is tested.

Figure 11:
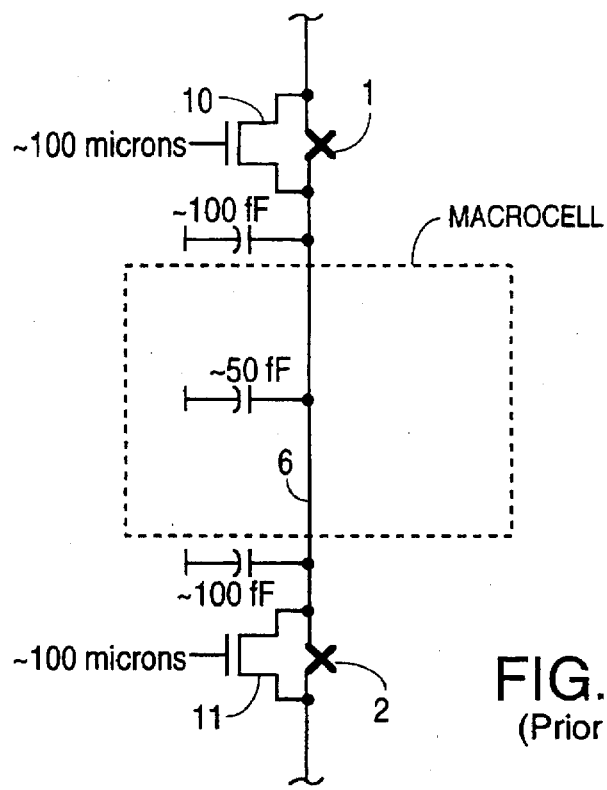
FIG. 11 (Prior Art) is a diagram illustrating a prior art architecture in which a pass programming transistor is coupled to one end of a vertical wire segment and another pass programming transistor is coupled to another end of the vertical wire segment.

FIG. 11 (Prior Art) shows a prior art architecture in which vertical wire segment 6 of a string of vertical wire segments has a pass programming transistor 10 and associated antifuse 1 on its upper end as well as a pass programming transistor 11 and associated antifuse 2 on its lower end as explained above in connection with FIG. 1. Each pass programming transistor is a large, approximately 100 micron, high breakdown voltage transistor which adds approximately 100 fF to the approximately 50 fF of the vertical wire segment 6. The dashed box represents a boundary of one embodiment of a macrocell.

Figure 12:
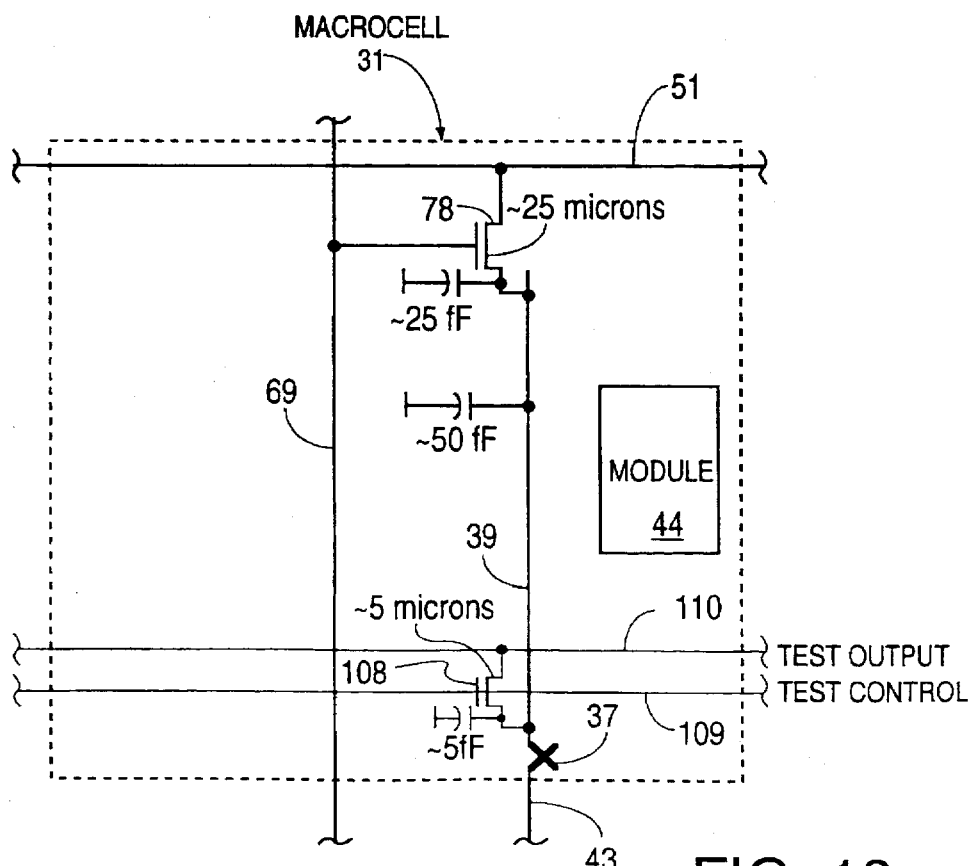
FIG. 12 is a simplified diagram of a part of FIG. 3 showing a small test transistor.

FIG. 12 is a simplified diagram of a part of FIG. 3. Because only one programming transistor 78 is coupled to the wire segment, the capacitance on the wire segment, is reduced. Programming transistor 78 can be made smaller than pass transistor 10 of FIG. 11 as explained above because the programming current need not flow through an entire string of wire segments and programming transistors. Programming transistor 78 therefore can have a higher on resistance. Programming transistor 78 may, for example, be a 25 micron transistor which adds a small capacitance such as 25 fF to the approximately 50 fF of vertical wire segment 39. Programming transistor 78 is coupled to vertical wire segment 39 at a location close to the top end of vertical wire segment 39.

FIG. 12 also shows a test transistor 108 coupled to vertical wire segment 39 at a location close to the bottom end of vertical wire segment 39 near antifuse 37. To test the integrity of vertical wire segment 39 between the programming transistor 78 and the test transistor 108, test transistor 108 is turned on via test control conductor 109 so that a current flows from programming conductor 51, through programming transistor 78, through wire segment 39, through test transistor 108, and to test output conductor 110. A break in wire segment 39 is detected when no current can be made to flow in the test current path. If test output conductor 110 is coupled to a voltage less than Vpp (for example Vpp/2) during the programming of antifuse 37, then the breakdown requirements on test transistor 108 are reduced, therefore allowing test transistor 108 to be a small (for example, 5 micron) transistor which only adds approximately 5 fF to the capacitance of vertical wire segment 39. The structure of FIG. 12 therefore may reduce the total amount of capacitance present on wire segments of a programmable ASIC. In some embodiments, the structure of FIG. 12 is repeated numerous times across each row of macrocells. If the gates of all test transistors in a row are coupled together by a horizontal extending test control conductor 109, then an entire row of vertically extending wire segments such as wire segment 39 can be tested simultaneously. In some embodiments, a triple layer metal process is used so that conductors 109 and 110 do not increase the size of the integrated circuit.

Figure 13:
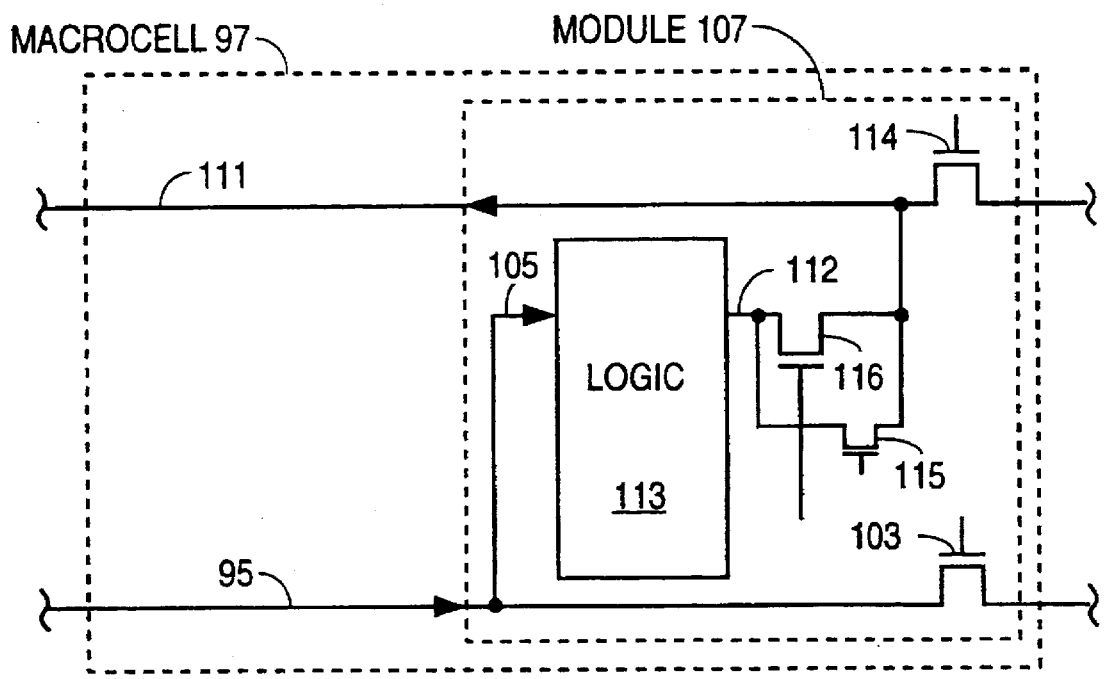
FIG. 13 (Prior Art) shows a prior art structure corresponding with FIG. 8.

FIG. 13 (Prior Art) shows additional details of a macrocell of the prior art such as macrocell 97 of structure corresponding FIG. 8. A second horizontally extending segment 111 is usable to establish connections to an output terminal 112 of the logic 113 in module 107. Transistor 114 has a similar function as transistor 103 and is used to conduct a programming voltage through the columns of modules across the chip for the programming of antifuses. Transistors 103 and 114 are nonconductive during normal operation of the circuit after programming. Because the voltage on horizontal wire 111 may be driven with the programming voltage Vpp during antifuse programming depending on which particular antifuses are to be programmed, output protection transistors 115 and 116 are provided to protect the output transistors inside logic 113 which are coupled to output terminal 112 of logic 113. Transistors 115 and 116 are relatively large in order to be able to withstand the programming voltage without breaking down. Transistors 115 and 116 are conductive during normal operation so that the signals output from logic 113 can be driven onto horizontal wire 111 and output from the module.

Figure 14:
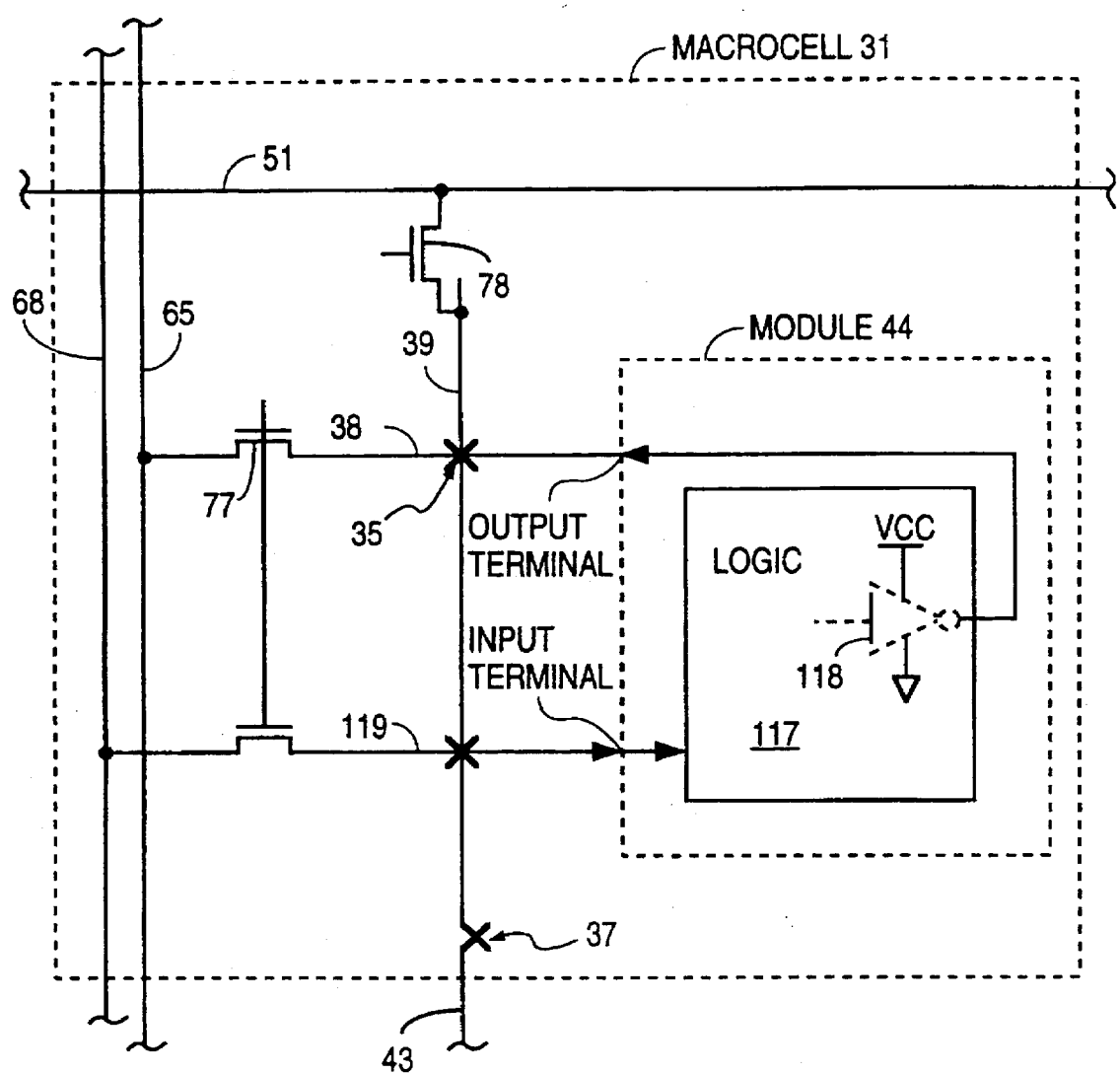
FIG. 14 is a diagram of a macrocell in accordance with an embodiment of the present invention.

FIG. 14 is a diagram of macrocell 31 in accordance with an embodiment of the present invention. Horizontal wire segment 38 is coupled to an output terminal of the logic 117 in module 44. The inverter 118 illustrated in FIG. 14 generically represents a digital logic element of logic 117 which drives a signal onto horizontal wire segment 38 during normal circuit operation. Horizontal wire segment 119 is another horizontal wire segment which is coupled to an input terminal of a digital logic element of logic 117. Due to the control afforded by the architecture of FIG. 3, the horizontal wire segments in some embodiments need not be driven with the programming voltage Vpp. To program cross antifuse 35, for example, vertical wire segment 39 may be driven with the programming voltage Vpp so that the horizontal wire segment 38 is maintained at ground potential via programming transistor 77 during antifuse programming. If vertical antifuse 37 is to be programmed, then vertical wire segment 39 may be driven with the programming voltage Vpp but all horizontal wire segments extending to terminals of the logic 117 may be driven with the intermediate voltage Vpp/2. Accordingly, the output transistors in logic element 118 do not need to be protected from high voltages by additional transistors 115 and 116. The elimination of transistors 115 and 116 saves space and increases speed.

In some embodiments, logic element 118 is used to drive horizontal wire segment 38 with a low voltage (for example, 0 volts) or an intermediate voltage (for example, Vcc) during antifuse programming. The programming transistor 77 and the associated vertical programming conductor 65 therefore need not be provided. To increase the amount of current which logic element 118 can sink to ground, the supply voltage ($V_{cc}$) supplied to logic element 118 can be increased and/or the size of the pull-down transistors in the logic element 118 can be increased. If programming transistor 77 is omitted, a relatively small testing transistor may be coupled to horizontal wire segment 38 in order to provide the ability to test the integrity of wire segment 38. Alternatively, a testing transitor may not be provided, rather an output driver (not shown) may be coupled to wire 38 in macrocells adjacent the periphery of the integrated circuit chip.

Figure 15:
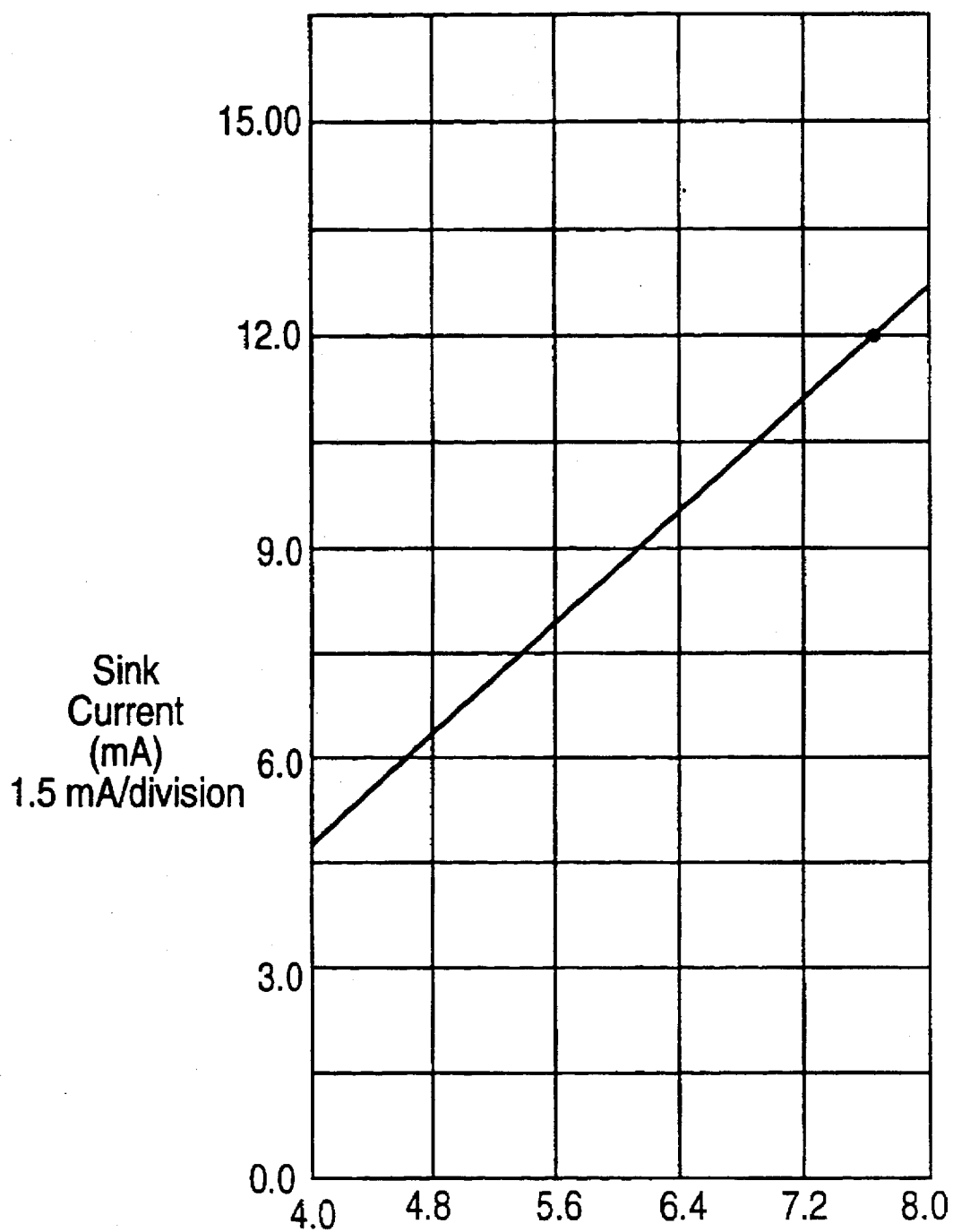
FIG. 15 is a graph of sink current versus supply voltage in accordance with an embodiment of the present invention.

FIG. 15 is a graph showing the current sink capability of a 25/0.65 micron geometry pull-down transistor when the supply voltage $V_{cc}$ of logic element 118 is varied over the range from 4.0 volts to 8.0 volts. With a supply voltage of 7.5 volts, the current sink capability of the pull-down transistor is the desired 12 mA for programming an amorphous silicon antifuse of a given feature size.

Figure 16:
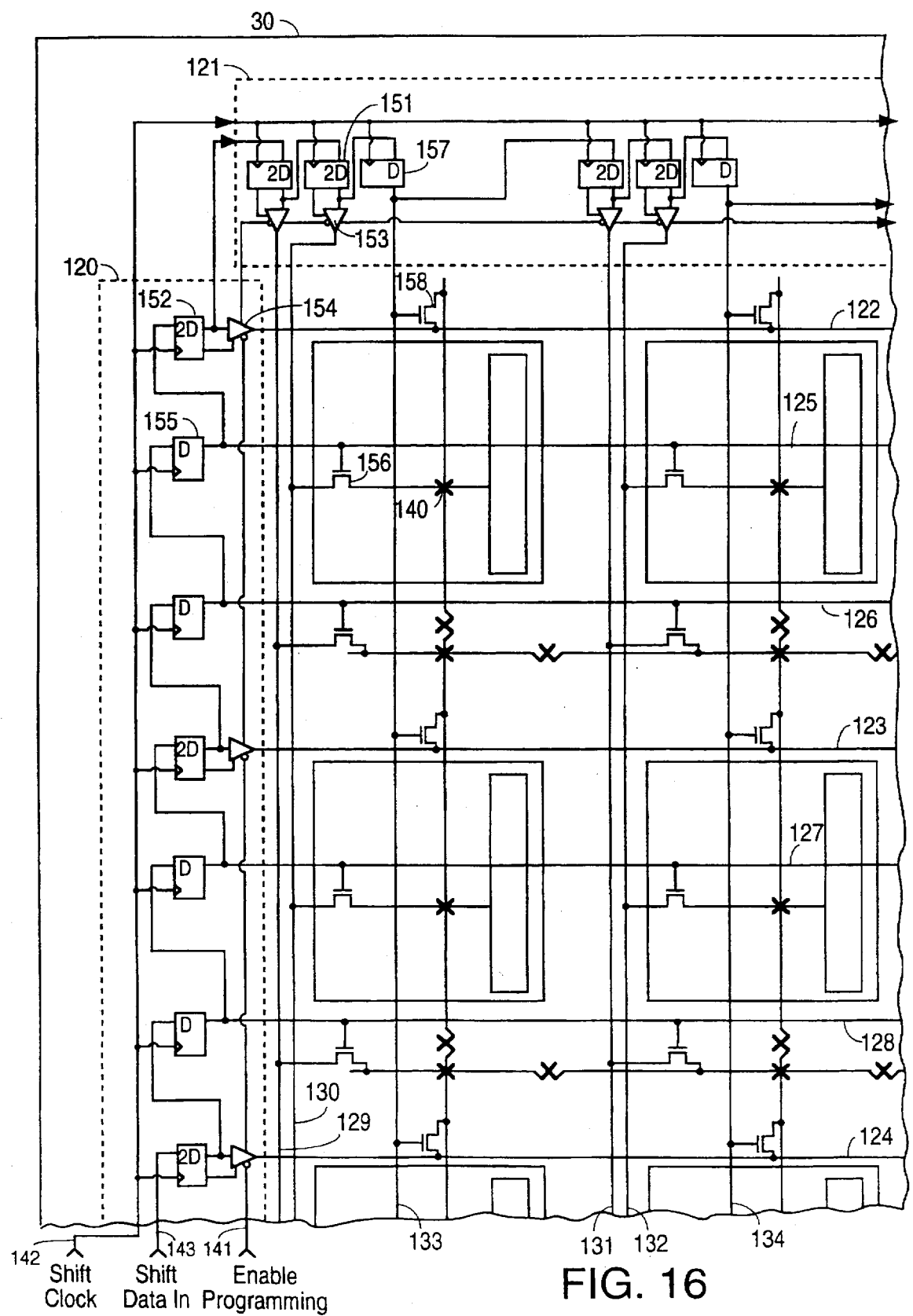
FIG. 16 is a simplified conceptual diagram of an upper-left corner portion of an integrated circuit chip in accordance with another embodiment of the present invention.

It is to be understood that the specific embodiment of FIG. 3 is not the only embodiment which may be practiced in accordance with the present invention. FIG. 16, for example, is a simplified conceptual diagram of an upper-left corner portion of integrated circuit chip 30. The macrocells of FIG. 16 are similar to those of FIG. 3, the horizontal and vertical antifuses not being illustrated as part of the macrocells.

The portion of integrated circuit chip 30 illustrated in FIG. 16 comprises a part of a horizontal programming address shift register 120 and a part of a vertical programming address shift register 121. Programming address shift register 120 addresses a plurality of horizontally extending programming conductors 122–124 as well as a plurality of horizontally extending control conductors 125–128. Programming address shift register 121 addresses a plurality of vertically extending programming conductors 129–132 as well as a plurality of vertically extending control conductors 133–134. As in the embodiment of FIG. 3, each programming conductor can be driven with a voltage of either Vpp, Vpp/2 or ground potential GND.

FIG. 17 is a diagram of a programming driver 135 in accordance with an embodiment of the present invention. It is to be understood that other types of programming drivers can be used. Programming driver 135 has three input terminals 136–138 and one output terminal 139. Terminal 138 is a disable terminal (an active low enable terminal). If a digital 1 is present on disable input terminal 138, then the programming driver 135 drives a voltage of Vpp/2 onto output terminal 139 regardless of the voltages on the other input terminals 136 and 137. Similarly, if a digital 0 is supplied to input terminal 137 (an active high enable terminal), then a voltage of Vpp/2 is driven onto output terminal 139 regardless of the voltage on data input terminal 136. FIG. 18 sets forth the operation of programming driver 135.

To program cross antifuse 140 of FIG. 16, for example, a digital 1 is placed on an active low enable programming input terminal 141 of the horizontal programming address shift register 120. Because the disable terminals of all the programming drivers of the two programming address shift registers 120 and 121 are coupled to the enable programming terminal 141, all of the programming conductors of integrated circuit 30 are driven with intermediate voltage Vpp/2. None of the antifuses can be programmed because a sufficient voltage cannot be developed across any antifuse to program the antifuse. The individual flip-flops of the two programming address shift registers 120 and 121 are loaded serially via a shift clock input terminal 142 and a shift data in input terminal 143.

FIG. 19 is a diagram showing the contents of one of the logic elements labeled 2D in FIG. 16. Input terminal 144 is a clock input terminal, input terminal 145 is a data input terminal, output terminal 146 is a first data output terminal, and output terminal 147 is a second data output terminal. Flip-flop 148 is an enable bit for an associated programming driver 149 whereas flip-flop 150 is a data bit supplying the data input signal to the data input terminal of programming driver 149.

In FIG. 16, if only cross antifuse 140 is to be programmed, then the enable bits of each 2D logic element in the horizontal and vertical programming address shift registers 120 and 121 controlling the programming conductors other than vertical programming conductor 130 and horizontal programming conductor 122 are loaded with a digital 0. Accordingly, when the voltage on the active low enable programming input terminal 141 is later lowered to a digital 0, all the programming conductors other than programming conductors 130 and 122 will remain driven with intermediate voltage Vpp/2. The data in the data bit of these 2D logic elements is therefore a "don't care" (i.e., a digital "X") due to the operation of the programming drivers as set forth in FIG. 18.

To establish a programming voltage of a magnitude approximately equal to Vpp across cross antifuse 140, the enable bits of 2D logic elements 151 and 152 associated with programming drivers 153 and 154 and programming conductors 130 and 122 are loaded with a digital 1. The data bits of the two 2D logic elements 151 and 152 are loaded with different digital values. If, for example, programming conductor 130 is to be driven with programming voltage Vpp, then the data bit of 2D logic element 151 is loaded with a digital 1 and the data bit of 2D logic element 152 is loaded with a digital 0.

Flip-flop 155 of the horizontal programming address shift register drives the control conductor 125 which controls the programming transistor 156. A digital 1 is therefore loaded into flip-flop 155 to cause programming transistor 156 to be conductive whereas a digital 0 is loaded into all the other flipflops of the horizontal programming address shift register 120 which control other horizontally extending control conductors. Similarly, a digital 1 is loaded into flip-flop 157 to cause programming transistor 158 to be conductive whereas a digital 0 is loaded into all the other flip-flops of the vertical programming address shift register 121 which control other vertically extending control conductors. When the voltage on the active low enable programming input terminal 141 is lowered to a digital 0, programming driver 153 drives programming voltage Vpp onto vertically extending programming conductor 130 and programming driver 154 drives horizontally extending programming conductor 122 to ground potential GND. Because programming transistors 156 and 158 are on, antifuse 140 is programmed. Each of the other antifuses illustrated in programmable integrated circuit 30 can be programmed in similar fashion by serially loading flip-flops of the horizontal and vertical address shift registers appropriately and then enabling the programming drivers by pulsing the voltage on the enable programming input terminal 141 with a digital 0.

FIG. 16 shows only two programming conductors extending through each of the individual macrocells for ease of explanation and for clarity of illustration. There may, however, be many different programming conductors passing through each macrocell. Moreover, FIG. 16 only shows two programming transistors in each of the individual macrocells for ease of explanation and for clarity of illustration. There may, however, be many programming transistors controlled by separate control conductors. Because two flip-flops are used to control each programming conductor in the embodiment of FIG. 16, and because one flip-flop is used to drive each control conductor in the embodiment of FIG. 16, the horizontal and vertical programming address shift registers 120 and 121 may require significant silicon area in programmable integrated circuits having many rows and many columns of macrocells.

Because the programming of each individual antifuse requires a significant amount of time, the programming of the many antifuses in a particular user-specific circuit realized in a programmable ASIC may be undesirably slow. A method of programming a programmable ASIC is therefore disclosed whereby multiple antifuses at corresponding locations in different macrocells are programmed simultaneously. Because the same leads extending from the programming address shift registers are supplied to the various programming enable circuits in parallel, corresponding antifuses in different macrocells can be programmed simultaneously by enabling the appropriate programming enable circuits and by disabling the other programming enable circuits. If, for example, a user-specific circuit required corresponding cross antifuses 35, 35A, 35B, 35C, to be programmed, then the programming enable circuits 46, 47, 49 and 50 are all enabled via their respective enable input leads. All four antifuses would be programmed at once. Similarly, multiple corresponding horizontal antifuses or vertical antifuses in for example the embodiment of FIG. 3 can be programmed simultaneously.

Accordingly, a user-specific design is analyzed to determine a group of antifuses consisting of the greatest number of corresponding antifuses that can be programmed at once. (It would not, for example, be possible to program antifuses 35, 35A and 35B simultaneously in the specific circuit illustrated in FIG. 3 without also programming antifuse 35C.) This group of antifuses is then programmed at once. When programming more than one antifuse at a time, the programming driver must be capable of supplying the increased amount of current necessary to program the extra antifuses. Subsequently, a second group of antifuses consisting of the next greatest number of corresponding antifuses that can be programmed at once is programmed. Thereafter, a third group of antifuses consisting of the next greatest number of corresponding antifuses that can be programmed at once is programmed, and so forth. The programming time required to program a programmable ASIC may therefore be greatly reduced. In some embodiments, particular antifuses may be members of more than one of the above-described groups, thereby allowing programming current to be forced through the same antifuses more than once and thereby allowing larger groups of antifuses to be programmed at once.

Figure 20:
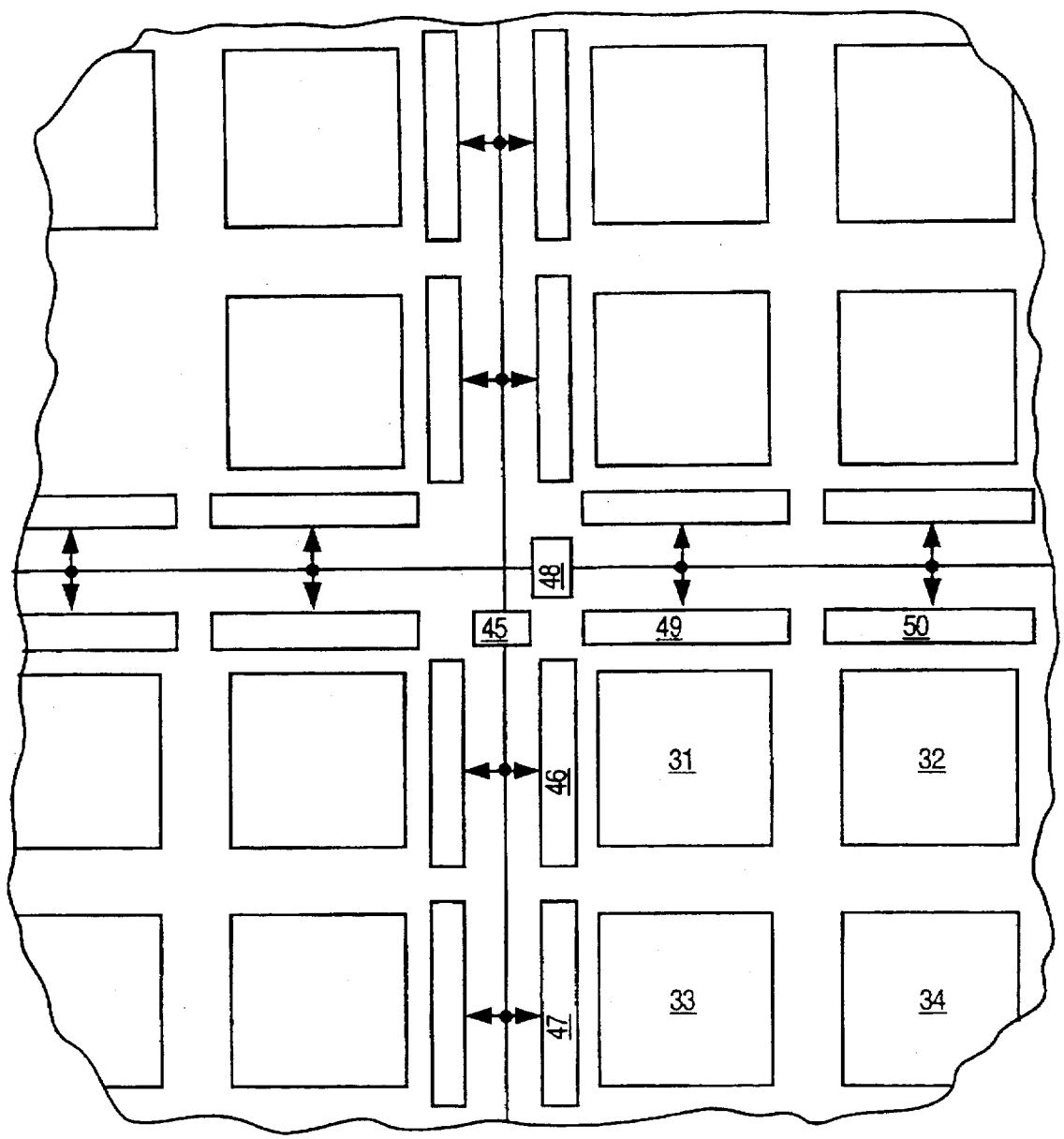
FIG. 20 is a simplified diagram which illustrates another configuration of an integrated circuit chip in accordance with another embodiment of the present invention.

The locations of the programming address shift registers and the programming enable circuits are not, of course, limited to the specific locations illustrated in connection with the specific embodiments of FIGS. 3 and 16. FIG. 20 shows programming enable circuits aligned in a cross-shape with programming address shift registers located at the center of the cross-shape. Multiple other configurations are also possible. In some embodiments, the vertical and horizontal programming address circuits do not involve flip-flops but merely involve terminals on the integrated circuit and leads extending in parallel from the terminals to the respective address input leads of the programming enable circuits.

The subject matter of the following documents is incorporated herein by reference: U.S Pat. No. 5,220,213 entitled "Programmable Application Specific Integrated Circuit And Logic Cell Therefor" and U.S. Pat. No. 5,294,846 entitled "Method And Apparatus For Programming Anti-Fuse Devices", which disclose programmable ASIC device structures having antifuses; U.S. Pat. No. 5,196,724 entitled "Programmable Interconnect Structures And Programmable Integrated Circuits"; U.S. patent application Ser. No. 07/447,969 entitled "Method For Fabrication Of Programmable Interconnect Structure"; U.S. patent application Ser. No. 07/698,648 entitled "Amorphous Silicon Antifuses and Methods For Fabrication Thereof", which disclose amorphous silicon antifuse structures for use in programmable ASICs; U.S. Pat. No. 5,302,546 entitled ,"Programming Of Antifuses"; U.S. Pat. No. 5,243,226 entitled "Programming Antifuse"; U.S. Pat. application Ser. No. 07/907,904 entitled "Field Programmable of Antifuse, Device And Programming Method Therefor"; and U.S. patent application Ser. No. 07/937,071 entitled "Method Of Determining An Electrical Characteristic Of An Antifuse And Apparatus Therefor", which disclose methods for programming amorphous silicon antifuses in programmable ASICs.

Although the present invention is described in connection with certain specific embodiments for instructional purposes, the present invention is not limited thereto. The terms horizontal and vertical are relative to one another and are otherwise not limiting. The depictions of the various structures in the various diagrams are merely illustrative. Wire segments in some embodiments span more than one macrocell. The voltages, sizes and capacitances set forth in the specification are presented as illustrative examples. The sizes and capacitances of structures of the present invention may vary depending on the particular geometry and process technology used. It is to be understood that Vpp/2 is used in this specification as an example of an intermediate voltage and that an intermediate voltage can be employed which is not halfway between the programming voltage and ground. Aspects of the present invention are not limited to amorphous silicon antifuses but rather extend to other antifuse and programmable device structures. Accordingly, various modifications, adaptations, and combinations of various features of the described embodiments can be practiced without departing from the scope of the invention as set forth in the appended claims.

I claim:

1. A field programmable gate array, comprising:
a programmable interconnect structure; and
a plurality of logic modules, each of said logic modules comprising:
   a first combinatorial logic circuit having five input leads and an output lead, each of said input leads and said output lead extending from said logic module and into said programmable interconnect structure;
   a second combinatorial logic circuit having six input leads and an output lead, five of said input leads and said output lead extending from said logic module and into said programmable interconnect structure, one of said input leads not extending from said logic module; and
   a first multiplexer having a first data input lead, a second data input lead, a select input lead and an output lead, said first data input lead being directly connected to said output lead of said first combinatorial logic circuit within said logic module, said second data input lead extending from said logic module and into said programmable interconnect structure, said select input lead extending from said logic module and into said programmable interconnect structure, said output lead of said first multiplexer being directly connected to said input lead of said second combinatorial logic circuit which does not extend from said logic module.

2. The field programmable gate array of claim 1, wherein a signal passing from said first combinatorial logic circuit to said second combinatorial logic circuit via said first multiplexer does not pass through any antifuses.

3. The field programmable gate array of claim 1, wherein said first combinatorial logic circuit has an additional input lead which extends from said logic module.

4. The field programmable gate array of claim 1, wherein said first combinatorial logic circuit is a six input AND gate.

5. The field programmable gate array of claim 1, wherein said second combinatorial logic circuit comprises:
   a second multiplexer having a first data input lead, a second data input lead, a select input lead, an output lead;
   a third multiplexer having a first data input lead, a second data input lead, a select input lead, an output lead; and
   a fourth multiplexer having a first data input lead coupled to said output lead of said second multiplexer, a second data input lead coupled to said output lead of said third multiplexer, a select input lead, an output lead.

6. The field programmable gate array of claim 5, wherein said output lead of said first multiplexer is directly connected to said select input lead of said second multiplexer.

7. The field programmable gate array of claim 1, wherein said second combinatorial logic circuit in each of said plurality of logic modules has an additional input lead which does not extend from said logic module, and wherein each of said logic modules further comprises:
   a third combinatorial logic circuit having five input leads and an output lead, each of said input leads and said output lead extending from said logic module and into said programmable interconnect structure; and
   a second multiplexer having a first data input lead, a second data input lead, a select input lead and an output lead, said first data input lead of said second multiplexer being directly connected to said output lead of said third combinatorial logic circuit within said logic module, said second data input lead of said second multiplexer extending from said logic module and into said programmable interconnect structure, said select input lead of said second multiplexer extending from said logic module and into said programmable interconnect structure, said output lead of said second multiplexer being directly connected to said additional input lead of said second combinatorial logic circuit which does not extend from said logic module.

8. The field programmable gate array of claim 1, wherein each of said logic modules further comprises:
   a sequential logic element having a data input lead, a clock input lead, and a data output lead, said data input lead of said sequential logic element being coupled to said output lead of said second combinatorial logic circuit.

9. The field programmable gate array of claim 5, wherein said second combinatorial logic circuit further comprises:
   a fifth multiplexer having a first data input lead, a second data input lead, a select input lead and an output lead, said first data input lead of said fifth multiplexer being directly connected to said output lead of said first combinatorial logic circuit within said logic module, said second data input lead of said fifth multiplexer extending from said logic module and into said programmable interconnect structure, said select input lead of said fifth multiplexer extending from said logic module and into said programmable interconnect structure, said output lead of said fifth multiplexer being directly connected to said select input of said third multiplexer.

10. A field programmable gate array, comprising:
an interconnect structure; and
a plurality of logic modules, each of said logic modules comprising:
   a first combinatorial logic circuit having five input leads and an output lead O1, each of said input leads and said output lead O1 extending from said logic module and into said interconnect structure;
   a second combinatorial logic circuit having seven input leads and an output lead, five of said input leads and said output lead extending from said logic module and into said interconnect structure, two of said input leads I1 and I2 not extending from said logic module;
   a third combinatorial logic circuit having five input leads and an output lead O2, each of said input leads and said output lead O2 extending from said logic module and into said interconnect structure;
   first means for selectively coupling said output lead O1 to said input lead I1 such that a signal passing from said output lead O1 to said input lead I1 passes through no permanently programmed element, said first means also being for selectively decoupling said output lead O1 from said input lead I1 such that said second combinatorial logic circuit can be used independently of said first combinatorial logic circuit without said input lead I1 being permanently driven with one digital logic value; and second means for selectively coupling said output lead O2 to said input lead I2 such that a signal passing from said output lead O2 to said input lead I2 passes through no permanently programmed element, said second means also being for selectively decoupling said output lead O2 from said input lead I2 such that said second combinatorial logic circuit can be used independently of said first combinatorial logic circuit without said input lead I2 being permanently driven with one digital logic value.

11. The field programmable gate array of claim 10, wherein said first means has an input lead, and wherein programming an antifuse coupled to said input lead of said first means causes said output lead O1 to be coupled to said input lead I1.

12. The field programmable gate array of claim 10, wherein said first means has an input lead, and wherein programming an antifuse coupled to said input lead of said first means causes said output lead O1 to be decoupled from said input lead I1.

13. The field programmable gate array of claim 10, wherein each of said logic modules further comprises:

a sequential logic element having a data input lead directly connected within said logic module to an output lead of one of said first, second and third combinatorial logic circuits.

* * * * *